US011362287B2

(12) United States Patent
Yam et al.

(10) Patent No.: US 11,362,287 B2
(45) Date of Patent: Jun. 14, 2022

(54) LUMINESCENT CYCLOMETALATING TRIDENTATE LIGAND-CONTAINING GOLD(III) COMPOUNDS WITH ARYL AUXILIARY LIGANDS FOR ORGANIC LIGHT-EMITTING DEVICES AND THEIR PREPARATION THEREOF

(71) Applicant: THE UNIVERSITY OF HONG KONG, Hong Kong (HK)

(72) Inventors: Vivian Wing-Wah Yam, Hong Kong (HK); Man Chung Tang, Hong Kong (HK); Mei Yee Chan, Hong Kong (HK); Chin Ho Lee, Hong Kong (HK); Lok Kwan Li, Hong Kong (HK)

(73) Assignee: THE UNIVERSITY OF HONG KONG, Hong Kong (HK)

(*) Notice: Subject to any disclaimer, the term of this patent is extended or adjusted under 35 U.S.C. 154(b) by 467 days.

(21) Appl. No.: 16/339,013

(22) PCT Filed: Oct. 3, 2017

(86) PCT No.: PCT/CN2017/105241
§ 371 (c)(1),
(2) Date: Apr. 3, 2019

(87) PCT Pub. No.: WO2018/067974
PCT Pub. Date: Apr. 12, 2018

(65) Prior Publication Data
US 2020/0044167 A1 Feb. 6, 2020

Related U.S. Application Data

(60) Provisional application No. 62/403,799, filed on Oct. 4, 2016.

(51) Int. Cl.
H01L 51/50 (2006.01)
H01L 51/00 (2006.01)
(Continued)

(52) U.S. Cl.
CPC ............ *H01L 51/0091* (2013.01); *C07F 1/00* (2013.01); *C09K 11/06* (2013.01);
(Continued)

(58) Field of Classification Search
None
See application file for complete search history.

(56) References Cited

U.S. PATENT DOCUMENTS 7,572,912 B2    8/2009  Yam et al.
2007/0007882 A1*  1/2007  Fukuoka ............ H01L 51/0051
                                                    313/503
2008/0114151 A1   5/2008  Shirasawa et al.

FOREIGN PATENT DOCUMENTS

CN    101098946    1/2008
CN    101128507    2/2008

OTHER PUBLICATIONS

Cheng et, al., Color Tunable Organic Light-Emitting Devices with External Quantum Efficiency over 20% Based on Strongly Luminescent Gold(III) Complexes having Long-Lived Emissive Excited States; Advanced Materials 2014, 26, 2540-2546 (Year: 2014).*
(Continued)

Primary Examiner — Gregory D Clark
(74) Attorney, Agent, or Firm — Amin, Turocy & Watson, LLP

(57) ABSTRACT

A novel class of gold(III) compounds containing cyclometalated tridentate ligand and one aryl auxiliary ligand, both coordinated to a gold(III) metal center.

(Continued)

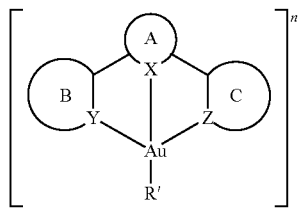

(a) X is nitrogen or carbon;
(b) Y and Z are independently nitrogen or carbon;
(c) A is cyclic structure (derivative) of pyridine, quinoline, isoquinoline or phenyl group;
(d) B and C are independently cyclic structures (derivatives) of pyridine, quinoline, isoquinoline or phenyl groups;
(e) B and C can be identical or non-identical, with the proviso that both B and C are not 4-tert-butylbenzene;
(f) R' is a substituted carbon, nitrogen, oxygen or sulfur donor ligand attached to the gold atom;
(g) n is zero, a positive integer or a negative integer.
wherein R' is selected from, but not limited to, aryl, substituted aryl, heteroaryl, substituted heteroaryl, heterocyclic aryl and substituted heterocyclic aryl, alkoxy, aryloxy, amide, thiolate, sulfonate, phosphide, fluoride, chloride, bromide, iodide, cyanate, thiocyanate or cyanide. Rings A, B and C are independently benzene or pyridine, or aryl (derivatives) or pyridyl, quinolyl, isoquinolyl (derivatives) with, but not limited to, one or more alkyl, alkenyl, alkynyl, alkylaryl, cycloalkyl, OR, $NR_2$, SR, C(O)R, C(O)OR, C(O)$NR_2$, CN, $CF_3$, $NO_2$, $SO_2$, SOR, $SO_3R$, halo, aryl, substituted aryl, heteroaryl, substituted heteroaryl or heterocyclic group, wherein R is independently alkyl, alkenyl, alkynyl, alkyaryl, aryl, or cycloalkyl.

13 Claims, 6 Drawing Sheets

(51) Int. Cl.
C07F 1/00 (2006.01)
C09K 11/06 (2006.01)
(52) U.S. Cl.
CPC .......... C09K 2211/1007 (2013.01); C09K 2211/1029 (2013.01); C09K 2211/188 (2013.01); H01L 51/001 (2013.01); H01L 51/0003 (2013.01); H01L 51/5016 (2013.01)

(56) References Cited

OTHER PUBLICATIONS

Bochmann;Cyclometallated gold(III) hydroxides as versatile synthons for Au—N, Au—C complexes and luminescent compounds; Chemical Communications, 2012, 48, 7247-7249. (Year: 2012).*
International Search Report and Written Opinion for International Patent Application No. PCT/CN2017/105241 dated Jan. 10, 2018, 8 pages.
Corbo, et al. "Access to the Parent Tetrakis(pyridine)gold(III) Trication, Facile Formation and Rare Au(III) Terminal Hydroxides, and Preliminary Studies of Biological Properties", Inorganic Chemistry, vol. 55, No. 6, Mar. 1, 2016, pp. 2830-2839, compounds 5-6.
Gimeno, et al. "Synthesis, Photochemical, and Redox Properties of Gold(I) and Gold(III) Pincer Complexes Incorporation a 2,2':6',2''—Terpyridine Ligand Framework, Inorganic Chemistry, vol. 54, No. 22, Oct. 23, 2015, pp. 10667-10677, Scheme 1, complexes 1 and 2.
Corbo, et al. "Facile Formation and Homoleptic Au(III) Trications via Simultaneous Oxidation and Ligand Delivery from [PhI(pyridine)2]2+", Journal of the American Chemical Society, vol. 136, No. 35, Aug. 19, 2014, pp. 12415-12421, Scheme 7, compounds 18 and 19.
Zhang, et al. "Organogold(III) Supramolecular Polymers for Anticancer Treatment", Angewandte Chemie, International Edition, vol. 51, No. 20, Dec. 31, 2012, pp. 4882-4886, Scheme 1, complexes 1 and 2.
Wong, et al. "Application of 2, 6-Diphenylpyridine as a Tridentate [L] Dianionic Ligand in Organogold(III) Chemistry. Structural and Spectroscopic Properties of Mono- and Binuclear Transmetalated Gold(III) Complexes", Organometallics, vol. 17, No. 16, Oct. 7, 1988, pp. 3505-3511, Scheme 1, compounds 2-3.
Kumar, et al. "Evidence for Direct Transmetalation of AuIII-F with Boronic Acids", JACS, vol. 138, No. 42, Sep. 29, 2016, pp. 13790-13793, Scheme 4.
International Preliminary Report on Patentability for International Patent Application No. PCT/CN2017/105241 dated Mar. 1, 2019, 38 pages.
Li, et al. "Strategies towards rational design of gold(III) complexes for high-performance organic light-emitting devices", Nature Photonics 2019, 13, 185-191.
Tang, et al. "Design Strategy Towards Horizontally Oriented Luminescent Tetradentate-Ligand-Containing Gold(III) Systems", Angewandte Chemie International Edition 2020, 59, 21023-21031.

* cited by examiner

LUMINESCENT CYCLOMETALATING TRIDENTATE LIGAND-CONTAINING GOLD(III) COMPOUNDS WITH ARYL AUXILIARY LIGANDS FOR ORGANIC LIGHT-EMITTING DEVICES AND THEIR PREPARATION THEREOF

FIELD OF THE INVENTION

Embodiments of the invention are related to the design and synthesis of a novel class of gold(III) compounds containing cyclometalated tridentate ligand and one aryl auxiliary ligand. These emitters can be fabricated by vacuum deposition or solution processing for applications in phosphorescent organic light-emitting devices (OLEDs).

BACKGROUND OF THE INVENTION

With the advantages of low cost, light weight, low operating voltage, high brightness, robustness, color tunability, wide viewing angle, ease of fabrication onto flexible substrates as well as low energy consumption, OLEDs are considered to be remarkably attractive candidates for flat panel display technologies and for solid-state lighting. Phosphorescent heavy metal complexes are an important class of materials in making OLEDs because of their relatively short triplet excited-state emission lifetimes and high luminescence quantum yields. The presence of a heavy metal center can effectively lead to a strong spin-orbit coupling and thus promotes an efficient intersystem crossing from its singlet excited state, eventually to the lowest-energy triplet excited state followed by relaxation to the ground state via phosphorescence at room temperature. This results in a four-fold enhancement in the internal quantum efficiency of OLEDs to reach a theoretical maximum of 100%.

Typically an OLED consists of several layers of semiconductor materials sandwiched between two electrodes. The cathode is composed of a low work function metal or metal alloy deposited by vacuum evaporation, whereas the anode is a transparent conductor such as indium-tin oxide (ITO). Upon the application of a DC voltage, holes injected by the ITO anode and electrons injected by the metal cathode will recombine to form excitons. Subsequent relaxation of excitons will then result in the generation of electroluminescence (EL).

The breakthroughs that led to the exponential growth of this field and to its first commercialized products can be traced to two pioneering demonstrations. In 1987, Tang and VanSlyke [Tang, C. W.; VanSlyke, S. A. *Appl. Phys. Lett.* 51, 913 (1987)] proposed the use of a double-layer structure of vacuum deposited, small-molecular films, in which tris(8-hydroxyquinoline)aluminum ($Alq_3$) was utilized both as the light-emitting layer and the electron transporting layer. Later, the first polymeric light-emitting device was pioneered by Burroughs et al. in 1990 [Burroughs, J. H.; Bradley, D. D. C.; Brown, A. R.; Marks, N.; Friend, R. H.; Burn, P. L.; Holmes, A. B. *Nature* 347, 539 (1990)], in which a yellow-green EL from poly(p-phenylenenvinylene) (PPV) was achieved. Since then, a number of new small molecular based and polymeric light-emitting materials have been investigated with improved light-emitting properties. The key advantage of using polymers as light-emitting materials is that they are highly soluble in most organic solvents, and the devices can be easily fabricated by using low-cost and efficient wet processing techniques, such as spin-coating, screen-printing, or ink-jet printing [Burrows, P. E.; Forrest, S. R.; Thompson, M. E. *Curr. Opin. Solid State Mat. Sci.* 2, 236 (1997)].

In 1998, Baldo et al. utilized 2,3,7,8,12,13,17,18-octaethyl-21H,23H-porphine platinum(II) (PtOEP) as emissive material and demonstrated a very encouraging external quantum efficiency (EQE) of up to 4% [Baldo, M. A.; O'Brien, D. F.; You, A.; Shoustikov, A.; Sibley, S.; Thompson, M. E.; Forrest, S. R. *Nature* 395, 151 (1998)]. Since then, organometallic compounds based on transition metal centers, such as iridium(III), rhenium(I), ruthenium(II), osmium(II), copper(I), gold(I), platinum(II), have attracted extensive attention in the past few decades and are considered as highly attractive candidates for full-color display technologies and energy-saving solid-state lighting systems [Tang, M.-C.; Chan, A. K.-W.; Chan. M.-Y; Yam, V. W.-W. *Top. Curr. Chem.* 374, 1 (2016)]. On the other hand, unlike the relatively mature platinum(II) systems, gold(III) compounds of isoelectronic $d^8$ electronic configuration have been less explored and only limited number of luminescent gold(III) complexes have been reported. It is believed that the presence of low-energy d-d ligand field excited states would quench the luminescence excited state through thermal equilibration or energy transfer [Yam, V. W. W.; Choi, S. W. K.; Lai, T. F.; Lee, W. K. *J. Chem. Soc., Dalton Trans.* 1001 (1993)]. This limitation has been overcome by Yam et al., in which the incorporation of strong σ-donating ligands on the gold(III) center, which would render the metal center less electrophilic as well as result in the enhancement of luminescence properties by raising the energy of the d-d states [Yam, V. W.-W.; Wong, K. M.-C.; Hung, L.-L.; Zhu, N. *Angew. Chem.* Int. Ed. 44, 3107 (2005); Wong, K. M.-C.; Hung, L.-L.; Lam, W. H.; Zhu, N.; Yam, V. W.-W. *J. Am. Chem. Soc.* 129, 4350 (2007); Wong, K. M.-C.; Zhu, X.; Hung, L.-L.; Zhu, N.; Yam, V. W.-W.; Kwok, H. S. *Chem. Commun.* 2906 (2005)]. In addition, the utilization of these luminescent gold(III) compounds as phosphorescent dopant materials in OLEDs yields strong EL with high EQE of about 5.5%. In order to further improve the EL performance of the bis-cyclometalated alkynylgold(III) systems, systematic modifications have been conducted on the bis-cyclometalated ligands as well as on the alkynyl ligands [Au, V. K.-M.; Tsang, D. P.-K.; Chan, M.-Y; Zhu, N.; Yam, V. W.-W. *J. Am. Chem. Soc.* 132, 14273 (2010); Au, V. K.-M.; Tsang, D. P.-K.; Wong, K. M.-C.; Chan, M.-Y; Zhu, N.; Yam, V. W.-W. *Inorg. Chem.* 52, 12713 (2013)]. It was found that the introduction of more conjugated and more rigid aryl-substituted diphenylpyridine and alkynyltriarylamine ligands onto the gold(III) metal center could generally improve their luminescence quantum yields. The optimized device with [Au(2,5-$F_2C_6H_3$-C^N^C)(C≡C—$C_6H_4N(C_6H_5)_2$-p] exhibited a maximum current efficiency of 37.4 cd $A^{-1}$, power efficiency of 26.2 lm $W^{-1}$, and a high EQE of 11.5%, that is comparable to those of the $Ir(ppy)_3$-based devices [Baldo, M. A.; Lamansky, S.; Burrows, P. E.; Thompson, M. E.; Forrest, S. E. *Appl. Phys. Lett.* 75, 4 (1999); Wong, K. M.-C.; Chan, M.-Y; Yam, V. W.-W. *Adv. Mater.* 26, 5558 (2014)]. In light of the interest in the use of phosphorescent materials for solution-processable OLEDs, further extension of the work had been made to the design and synthesis of phosphorescent dendrimers through the incorporation of the gold(III) complexes into a dendritic structure [Tang, M.-C.; Tsang, D. P.-K.; Chan, M.-Y; Wong, K. M.-C.; Yam, V. W.-W. *Angew. Chem. Int. Ed.* 52, 446 (2013); Tang, M.-C.; Tsang, D. P.-K; Wong, Y.-C.; Chan, M.-Y; Wong, K. M.-C.; Yam, V. W.-W. *J. Am. Chem. Soc.* 136, 17861 (2014); Tang, M.-C.; Chan, K. M.-C.; Tsang, D. P.-K.; Wong, Y.-C. Chan, M.-Y; Wong, K. M.-C.; Yam, V. W.-W. *Chem. Eur. J.* 20, 15233 (2014)]. In 2013, Yam and co-workers demonstrated the first report on the design and synthesis of gold(III) dendrimers; particularly, carbazole-based and triphenylamine-based dendritic alkynylgold(III) complexes have been synthesized. Efficient solution-processable OLEDs have been achieved by doping gold(III) complexes into m-(N,N'-dicarbazole)benzene (MCP) as emissive layer by spin-coating. A high yellow-emitting OLED with EQE of up to 10.1% was recorded. In addition, the incorporation of hole-transporting moieties, such as carbazole or triphenylamine, into the dendritic structure to form higher generation dendrimers could suppress the intermolecular interactions and reduce the bathochromic shift of the emission, similar to the cases for the iridium(III) dendrimers. More importantly, the emission energies could be effectively tuned from green to saturated red by a delicate design on the cyclometalated tridentate ligands as well as the dendrimer generations.

Although the photophysical properties of gold(III) compounds are exciting and attractive, the limited synthetic methods have hindered the emergence of organogold(III) chemistry. One of the notable works was made by Yam and co-workers, in which a series of luminescent organogold(III) diimine complexes have been successfully synthesized using Grignard reagents [Yam, V. W. W.; Choi, S. W. K.; Lai, T. F.; Lee, W. K *J. Chem. Soc., Dalton Trans.* 1001 (1993)]. Later, Bochmann and co-workers first reported the cyclometalated C^N^C gold(III) hydroxide complex as versatile synthons for Au—N and Au—C complexes [Rosca, D.; Smith, D. A.; Bochmann, M. *Chem. Commun.* 48, 7247 (2012)], and a number of gold(III) aryls, alkynyls and heteroaryls with intense room-temperature emission have been achieved. However, their synthetic route involves at least two synthetic steps to obtain their target complexes. Recently, Gray and co-workers reported the palladium-catalyzed Suzuki-Miyaura coupling of arylboronic acids coordinated to gold(III) chlorides with bidentate cyclometalated C^N ligands [Maity, A.; Sulica, A. N.; Deligonul, N.; Zeller, M.; hunter, A. D.; Gray, T. G. *Chem. Sci.* 6, 981 (2015)]. Both monoarylation and diarylation can be readily obtained. More importantly, the reactions can be carried out at room temperature, and the products are stable to air, moisture, and chromatography. This opens up a new approach for the formation of the metal-carbon bond under mild condition.

Herein, the present invention describes the design, synthesis and photoluminescence behaviors of luminescent gold (III) compounds with one aryl auxiliary group (FIG. 1). This class of complexes can be easily obtained by reacting the gold(III) chloride precursor complex with the corresponding arylboronic acids under palladium-catalyzed Suzuki-Miyaura coupling condition. The identities of compounds 1-14 have been confirmed by $^1$H NMR spectroscopy and FAB-mass spectrometry. All compounds have been isolated as thermally stable solids with decomposition temperatures of above 250° C. and the thermogravimetric analysis (TGA) trace of compound 1 has been shown in FIG. 2 as an example. Compound 2 is selected as triplet emitting material in the fabrication of both vacuum-deposited and solution-processable OLEDs with respectable EQEs of up to 14.7% and 5.9%, respectively.

BRIEF SUMMARY OF THE INVENTION

The objective of the present invention is to provide a novel class of tridentate ligand-containing gold(III) aryl compounds for applications in OLEDs. The invented gold (III) compound is a coordination compound that contains a tridentate cyclometalated ligand and one aryl group, both coordinated to a gold(III) metal center. Likewise, any aryl group can be employed as the ancillary ligand. Other embodiments of the invention are directed to OLEDs based on this class of luminescent gold(III) complexes.

The luminescent gold(III) compounds have the chemical structure shown in the generic formula (I),

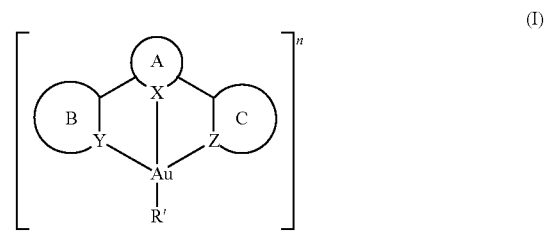

(a) X is nitrogen or carbon;
(b) Y and Z are independently nitrogen or carbon;
(c) A is cyclic structure (derivative) of pyridine, quinoline, isoquinoline or phenyl group;
(d) B and C are independently cyclic structures (derivatives) of pyridine, quinoline, isoquinoline or phenyl groups;
(e) B and C can be identical or non-identical, with the proviso that both B and C are not 4-tert-butylbenzene;
(f) R' is a substituted carbon, nitrogen, oxygen or sulfur donor ligand attached to the gold atom;
(g) n is zero, a positive integer or a negative integer.
wherein R' is selected from, but not limited to, aryl, substituted aryl, heteroaryl, substituted heteroaryl, heterocyclic aryl and substituted heterocyclic aryl, alkoxy, aryloxy, amide, thiolate, sulfonate, phosphide, fluoride, chloride, bromide, iodide, cyanate, thiocyanate or cyanide.

The present invention further includes the following embodiments:
1. A luminescent gold(III) compound having the chemical structure shown in formula (I),

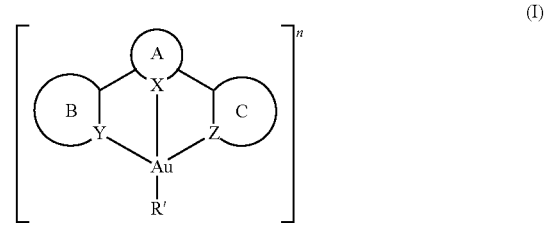

(a) X is nitrogen or carbon;
(b) Y and Z are independently nitrogen or carbon;
(c) A is cyclic structure (derivative) of pyridine, quinoline, isoquinoline or phenyl group; (d) B and C are independently cyclic structures (derivatives) of pyridine, quinoline, isoquinoline or phenyl groups;
(e) B and C can be identical or non-identical, with the proviso that both B and C are not 4-tert-butylbenzene;
(f) R' is a substituted carbon, nitrogen, oxygen or sulfur donor ligand attached to the gold atom;
(g) n is zero, a positive integer or a negative integer; and
wherein R' is selected from, but not limited to, aryl, substituted aryl, heteroaryl, substituted heteroaryl, heterocyclic aryl and substituted heterocyclic aryl, alkoxy, aryloxy, amide, thiolate, sulfonate, phosphide, fluoride, chloride, bromide, iodide, cyanate, thiocyanate or cyanide;

ring A is benzene, pyridine, or aryl (derivative), or pyridyl, quinolyl, isoquinolyl (derivative), but not limited to, with one or more alkyl, alkenyl, alkynyl, alkylaryl, cycloalkyl, OR, $NR_2$, SR, C(O)R, C(O)OR, $C(O)NR_2$, CN, $CF_3$, $NO_2$, $SO_2$, SOR, $SO_3R$, halo, aryl, substituted aryl, heteroaryl, substituted heteroaryl or heterocyclic group, wherein R is independently alkyl, alkynyl, alkylaryl, aryl or cycloalkyl; and rings B and C are independently benzene or pyridine, or aryl (derivatives), or pyridyl, quinolyl, isoquinolyl (derivatives), with one or more alkyl, alkenyl, alkynyl, alkylaryl, cycloalkyl, OR, $NR_2$, SR, C(O)R, C(O)OR, $C(O)NR_2$, CN, $CF_3$, $NO_2$, $SO_2$, SOR, $SO_3R$, halo, aryl, substituted aryl, heteroaryl, substituted heteroaryl or heterocyclic group, wherein R is independently alkyl, alkynyl, alkylaryl, aryl or cycloalkyl.

2. A method for preparing a luminescent compound with a cyclometalated tridentate ligand and at least one monoaryl group coordinated to a gold(III) metal group, comprising the following reaction:

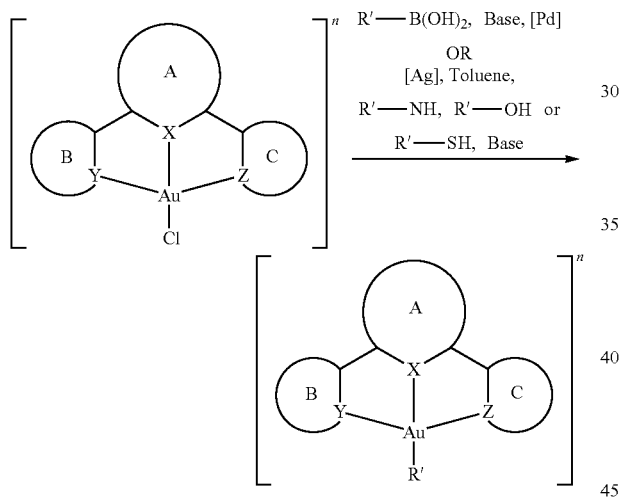
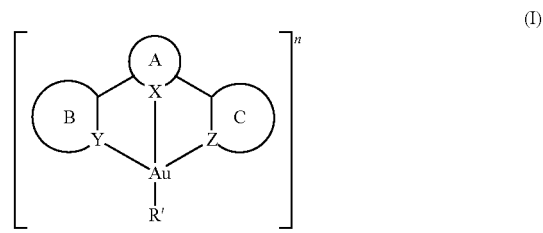

wherein ring A is benzene, pyridine, or aryl (derivative), or pyridyl, quinolyl, isoquinolyl (derivative), with one or more alkyl, alkenyl, alkynyl, alkylaryl, cycloalkyl, OR, $NR_2$, SR, C(O)R, C(O)OR, $C(O)NR_2$, CN, $CF_3$, $NO_2$, $SO_2$, SOR, $SO_3R$, halo, aryl, substituted aryl, heteroaryl, substituted heteroaryl or heterocyclic group, wherein R is independently alkyl, alkynyl, alkylaryl, aryl or cycloalkyl;

rings B and C are independently benzene or pyridine, or aryl (derivatives), or pyridyl, quinolyl, isoquinolyl (derivatives), with one or more alkyl, alkenyl, alkynyl, alkylaryl, cycloalkyl, OR, $NR_2$, SR, C(O)R, C(O)OR, $C(O)NR_2$, CN, $CF_3$, $NO_2$, $SO_2$, SOR, $SO_3R$, halo, aryl, substituted aryl, heteroaryl, substituted heteroaryl or heterocyclic group, wherein R is independently alkyl, alkynyl, alkylaryl, aryl or cycloalkyl; and R' is selected from aryl, substituted aryl, heteroaryl, substituted heteroaryl, heterocyclic aryl and substituted heterocyclic aryl, alkoxy, aryloxy, amide, thiolate, sulfonate, phosphide, fluoride, chloride, bromide, iodide, cyanate, thiocyanate or cyanide.

3. A light-emitting device with an ordered structure comprising an anode, a hole-transporting layer, a light-emitting layer, an electron-transporting layer and a cathode wherein the light-emitting layer comprises a gold(III) compound having a chemical structure represented by the following formula,

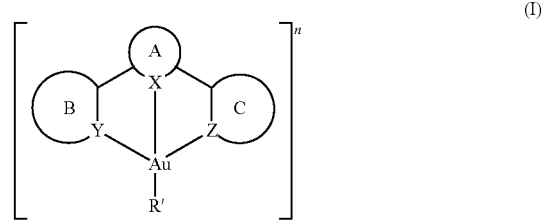

(a) X is nitrogen or carbon;
(b) Y and Z are independently nitrogen or carbon;
(c) A is cyclic structure (derivative) of pyridine, quinoline, isoquinoline or phenyl group;
(d) B and C are independently cyclic structures (derivatives) of pyridine, quinoline, isoquinoline or phenyl groups;
(e) B and C can be identical or non-identical, with the proviso that both B and C are not 4-tert-butylbenzene;
(f) R' is a substituted carbon, nitrogen, oxygen or sulfur donor ligand attached to the gold atom;
(g) n is zero, a positive integer or a negative integer;
wherein R' is selected from aryl, substituted aryl, heteroaryl, substituted heteroaryl, heterocyclic aryl and substituted heterocyclic aryl, alkoxy, aryloxy, amide, thiolate, sulfonate, phosphide, fluoride, chloride, bromide, iodide, cyanate, thiocyanate or cyanide;

ring A is benzene, pyridine, or aryl (derivative), or pyridyl, quinolyl, isoquinolyl (derivative), with one or more alkyl, alkenyl, alkynyl, alkylaryl, cycloalkyl, OR, $NR_2$, SR, C(O)R, C(O)OR, $C(O)NR_2$, CN, $CF_3$, $NO_2$, $SO_2$, SOR, $SO_3R$, halo, aryl, substituted aryl, heteroaryl, substituted heteroaryl or heterocyclic group, wherein R is independently alkyl, alkynyl, alkylaryl, aryl or cycloalkyl; and rings B and C are independently benzene or pyridine, or aryl (derivatives), or pyridyl, quinolyl, isoquinolyl (derivatives), with one or more alkyl, alkenyl, alkynyl, alkylaryl, cycloalkyl, OR, $NR_2$, SR, C(O)R, C(O)OR, $C(O)NR_2$, CN, $CF_3$, $NO_2$, $SO_2$, SOR, $SO_3R$, halo, aryl, substituted aryl, heteroaryl, substituted heteroaryl or heterocyclic group, wherein R is independently alkyl, alkynyl, alkylaryl, aryl or cycloalkyl.

The present invention additionally includes the following embodiments:

1. The novel luminescent gold(III) compounds have the chemical structure shown in the generic formula (I), (a) X is nitrogen or carbon;
(b) Y and Z are independently nitrogen or carbon;
(c) A is cyclic structure (derivative) of pyridine, quinoline, isoquinoline or phenyl group;
(d) B and C are independently cyclic structures (derivatives) of pyridine, quinoline, isoquinoline or phenyl groups;
(e) B and C can be identical or non-identical, with the proviso that both B and C are not 4-tert-butylbenzene;
(f) R' is a substituted carbon, nitrogen, oxygen or sulfur donor ligand attached to the gold atom;
(g) n is zero, a positive integer or a negative integer.
wherein R' is selected from, but not limited to, aryl, substituted aryl, heteroaryl, substituted heteroaryl, heterocyclic aryl and substituted heterocyclic aryl, alkoxy, aryloxy, amide, thiolate, sulfonate, phosphide, fluoride, chloride, bromide, iodide, cyanate, thiocyanate or cyanide. Rings A, B and C are independently benzene or pyridine, or aryl (derivatives) or pyridyl, quinolyl, isoquinolyl (derivatives) with, but not limited to, one or more alkyl, alkenyl, alkynyl, alkylaryl, cycloalkyl, OR, $NR_2$, SR, C(O)R, C(O)OR, C(O)$NR_2$, CN, $CF_3$, $NO_2$, $SO_2$, SOR, $SO_3R$, halo, aryl, substituted aryl, heteroaryl, substituted heteroaryl or heterocyclic group, wherein R is independently alkyl, alkenyl, alkynyl, alkyaryl, aryl, or cycloalkyl.

2. The gold(III) compound according to embodiment 1 wherein the compound is deposited as a thin layer on a substrate layer.
3. The gold(III) compound according to embodiment 2 wherein the thin layer is deposited by vacuum deposition, spin-coating, or inkjet printing.
4. The gold(III) compound according to embodiment 1, wherein the compound has photoluminescence properties within a range of about 380 to 1050 nm.
5. The gold(III) compound according to embodiment 1, wherein the compound emits light in response to the passage of an electric current or to a strong electric field.
6. The gold(III) compound according to embodiment 1, wherein the compound is used to fabricate an OLED.
7. The gold(III) compound according to embodiment 6, wherein the gold (III) compound serves as the light-emitting layer of the OLED.
8. The gold(III) compound according to embodiment 7, wherein the gold (III) compound serves as a dopant in the light-emitting layer of the OLED.
9. The gold(III) compound according to embodiment 8 wherein the emission energy of the compound is independent on the concentration of the gold(III) compound dopant.
10. A method for preparing a luminescent compound with a cyclometalated tridentate ligand and at least one monoaryl group coordinated to a gold(III) metal group, comprising the following reaction:
wherein:

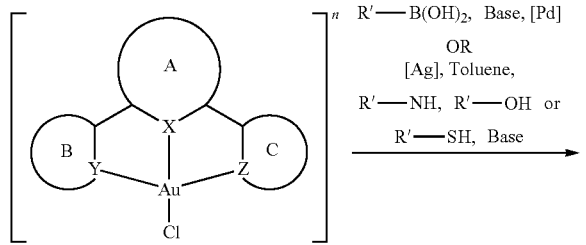

R' is selected from, but not limited to, aryl, substituted aryl, heteroaryl, substituted heteroaryl, heterocyclic aryl and substituted heterocyclic aryl, alkoxy, aryloxy, amide, thiolate, sulfonate, phosphide, fluoride, chloride, bromide, iodide, cyanate, thiocyanate or cyanide. Rings A, B and C are independently benzene or pyridine, or aryl (derivatives) or pyridyl, quinolyl, isoquinolyl (derivatives) with, but not limited to, one or more alkyl, alkenyl, alkynyl, alkylaryl, cycloalkyl, OR, $NR_2$, SR, C(O)R, C(O)OR, C(O)$NR_2$, CN, $CF_3$, $NO_2$, $SO_2$, SOR, $SO_3R$, halo, aryl, substituted aryl, heteroaryl, substituted heteroaryl or heterocyclic group, wherein R is independently alkyl, alkenyl, alkynyl, alkyaryl, aryl, or cycloalkyl.

11. The method according to embodiment 10 wherein a luminescent compound is prepared.
12. The method according to embodiment 10 wherein the gold(III) metal center comprises a light-emitting layer of a light-emitting device.
13. The method according to embodiment 10 wherein the gold(III) metal group comprises a layer of a light-emitting device.
14. The gold(III) compound according to embodiment 10 wherein the gold(III) metal compound is a dopant included in the light-emitting layer of the light-emitting device.
15. The method according to embodiment 10 wherein the gold(III) metal compound is a dopant included in a light-emitting device.
16. A light-emitting device with an ordered structure comprising an anode, a hole-transporting layer, a light-emitting layer, an electron-transporting layer and a cathode wherein the light-emitting layer comprises a gold(III) compound having a chemical structure represented by the following general formula (I), (a) X is nitrogen or carbon;
(b) Y and Z are independently nitrogen or carbon;
(c) A is cyclic structure (derivative) of pyridine, quinoline, isoquinoline or phenyl group;
(d) B and C are independently cyclic structures (derivatives) of pyridine, quinoline, isoquinoline or phenyl groups;

(e) B and C can be identical or non-identical, with the proviso that both B and C are not 4-tert-butylbenzene;
(f) R' is a substituted carbon, nitrogen, oxygen or sulfur donor ligand attached to the gold atom;
(g) n is zero, a positive integer or a negative integer.
wherein R' is selected from, but not limited to, aryl, substituted aryl, heteroaryl, substituted heteroaryl, heterocyclic aryl and substituted heterocyclic aryl, alkoxy, aryloxy, amide, thiolate, sulfonate, phosphide, fluoride, chloride, bromide, iodide, cyanate, thiocyanate or cyanide. Rings A, B and C are independently benzene or pyridine, or aryl (derivatives) or pyridyl, quinolyl, isoquinolyl (derivatives) with, but not limited to, one or more alkyl, alkenyl, alkynyl, alkylaryl, cycloalkyl, OR, $NR_2$, SR, C(O)R, C(O)OR, C(O)$NR_2$, CN, $CF_3$, $NO_2$, $SO_2$, SOR, $SO_3R$, halo, aryl, substituted aryl, heteroaryl, substituted heteroaryl or heterocyclic group, wherein R is independently alkyl, alkenyl, alkynyl, alkyaryl, aryl, or cycloalkyl.

17. The light-emitting device of embodiment 16 wherein the light-emitting layer is prepared using vacuum deposition or solution processing technique.

18. A light-emitting device having an ordered structure comprising an anode, a hole-transporting layer, a light-emitting layer, an electron-transporting layer and a cathode wherein the light-emitting layer comprises a gold(III) compound prepared according to the method of embodiment 10.

19. The light-emitting device of embodiment 18 wherein the light-emitting layer is prepared using vacuum deposition or solution processing technique.

In accordance with the present invention, these luminescent gold(III) complexes show either strong photoluminescence via a triplet excited state upon photo-excitation, or EL via a triplet exciton upon applying a DC voltage. These compounds according to embodiments of the invention are highly soluble in common organic solvents such as dichloromethane, chloroform and toluene. Alternatively, the compounds can be doped into a host matrix for thin film deposition by spin-coating or ink-jet printing or other known fabrication methods. In some embodiments of the invention, selected gold(III) compounds can be used for the fabrication of OLEDs as phosphorescent emitters or dopants to generate EL.

In an OLED according to the present invention, the luminescent gold(III) compound is included in a light-emitting layer. The typical structure of an OLED using luminescent compounds of the present invention as a light-emitting layer is in the order shown in FIG. 3: cathode/electron transporting layer/luminescent gold(III) compound as a light-emitting layer/hole transporting layer/anode. Sometimes, hole blocking layer and carrier confinement layer will be employed to improve the device performance.

DETAILED DESCRIPTION OF THE INVENTION

Figure 1:
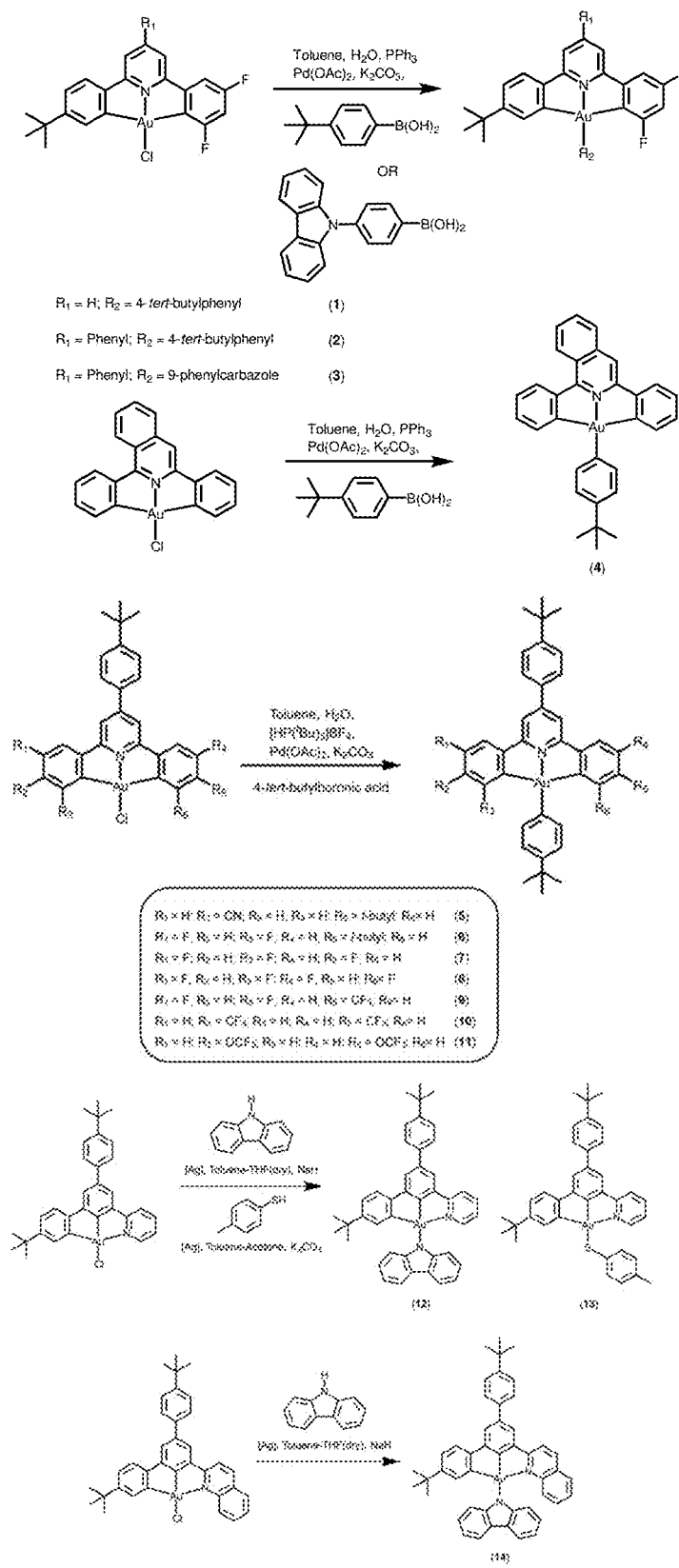
FIG. 1 shows the chemical structures of compounds 1-14.
Figure 2:
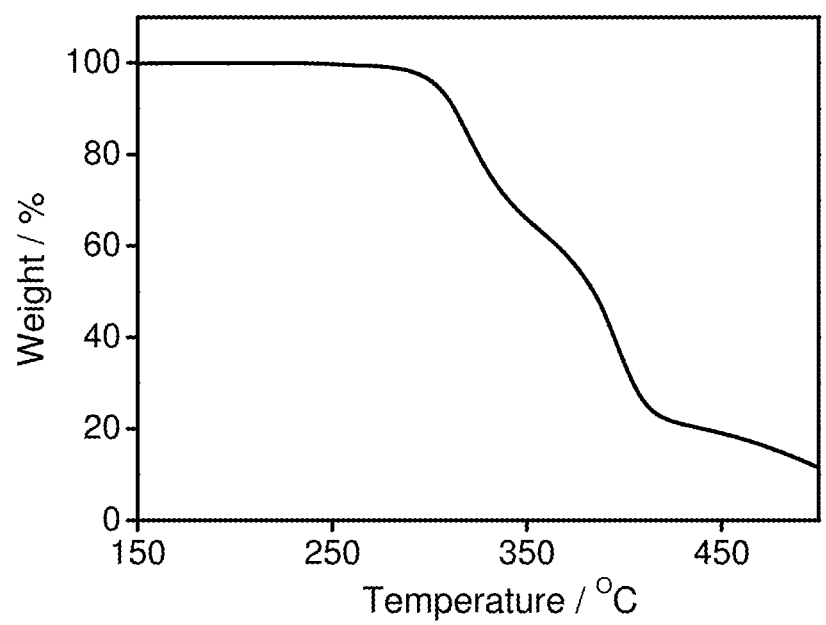
FIG. 2 shows the TGA trace of compound 1.

The objective of the present invention is to provide a novel class of cyclometalated gold(III) compounds for applications in OLEDs. The invented gold(III) compound is a coordination compound that contains a tridentate cyclometalated ligand and one aryl group, both coordinated to a gold(III) metal center. Likewise, any aryl group can be employed as the ancillary ligand. Other embodiments of the invention are directed to OLEDs based on this class of luminescent gold(III) complexes.

The luminescent gold(III) compounds have the chemical structure shown in the generic formula (I),

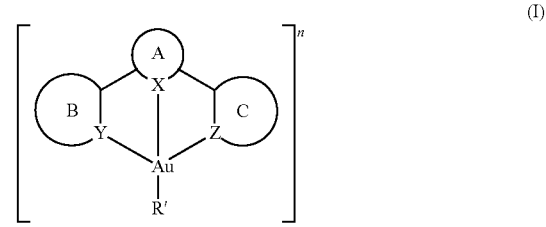

(a) X is nitrogen or carbon;
(b) Y and Z are independently nitrogen or carbon;
(c) A is cyclic structure (derivative) of pyridine, quinoline, isoquinoline or phenyl group; (d) B and C are independently cyclic structures (derivatives) of pyridine, quinoline, isoquinoline or phenyl groups;
(e) B and C can be identical or non-identical, with the proviso that both B and C are not 4-tert-butylbenzene;
(f) R' is a substituted carbon, nitrogen, oxygen or sulfur donor ligand attached to the gold atom;
(g) n is zero, a positive integer or a negative integer.
wherein R' is selected from, but not limited to, aryl, substituted aryl, heteroaryl, substituted heteroaryl, heterocyclic aryl and substituted heterocyclic aryl, alkoxy, aryloxy, amide, thiolate, sulfonate, phosphide, fluoride, chloride, bromide, iodide, cyanate, thiocyanate or cyanide.

Rings A, B and C are independently benzene or pyridine, or aryl (derivatives) or pyridyl, quinolyl, isoquinolyl (derivatives) with, but not limited to, one or more alkyl, alkenyl, alkynyl, alkylaryl, cycloalkyl, OR, $NR_2$, SR, C(O)R, C(O)OR, $C(O)NR_2$, CN, $CF_3$, $NO_2$, $SO_2$, SOR, $SO_3R$, halo, aryl, substituted aryl, heteroaryl, substituted heteroaryl or heterocyclic group, wherein R is independently alkyl, alkenyl, alkynyl, alkylaryl, aryl, or cycloalkyl.

In the present disclosure the following terms are used.

The term "optional" or "optionally" means that the subsequently described event or circumstance may or may not occur, and that the description includes instances where said event or circumstance occurs and instances in which it does not. For example, "optionally substituted alkyl" includes "alkyl" and "substituted alkyl," as defined below.

The term "halo" or "halogen" as used herein includes fluorine, chlorine, bromine and iodine.

The term "alkyl" as used herein includes straight and branched chain alkyl groups, as well as cycloalkyl group with cyclic structure of alkyl groups, such as cyclopropyl, cyclopentyl, cyclohexyl, and the like. Generally, the term "cycloalkyl" includes a cyclic alkyl group, typically having 3 to 8, preferably 5 to 7, carbon atoms. Preferred alkyl groups are those containing from one to eighteen carbon atoms, 2-10 carbon atoms, or 4-6 carbon atoms, and includes methyl, ethyl, propyl, isopropyl, butyl, isobutyl, tert-butyl, and the like. In addition, the alkyl group may be optionally substituted with one or more substituents selected from OR, $NR_2$, SR, C(O)R, C(O)OR, $C(O)NR_2$, CN, $CF_3$, $NO_2$, $SO_2$, SOR, $SO_3R$, halo and cyclic-amino, wherein R is independently alkyl, alkenyl, alkynyl, alkylaryl, aryl, or cycloalkyl. For example, the substituted alkyl can include mono-haloalkyl, di-haloalkyl, trihaloalkyl, specifically trichloroalkyl, such as trichloromethyl ($CF_3$), etc.

The term "alkenyl" as used herein includes both straight and branched chain alkene radicals. Preferred alkenyl groups are those containing two to eighteen carbon atoms. In addition, the alkenyl group may be optionally substituted with one or more substituents selected from OR, $NR_2$, SR, C(O)R, C(O)OR, $C(O)NR_2$, CN, $CF_3$, $NO_2$, $SO_2$, SOR, $SO_3R$, halo and cyclic-amino, wherein R is independently alkyl, alkenyl, alkynyl, alkylaryl, aryl, or cycloalkyl.

The term "alkynyl" as used herein includes both straight and branched chain alkyne radicals. Preferred alkynyl groups are those containing two to eighteen carbon atoms. In addition, the alkynyl group may be optionally substituted with one or more substituents selected from OR, $NR_2$, SR, C(O)R, C(O)OR, $C(O)NR_2$, CN, $CF_3$, $NO_2$, $SO_2$, SOR, $SO_3R$, halo and cyclic-amino, wherein R is independently alkyl, alkenyl, alkynyl, alkylaryl, aryl, or cycloalkyl.

The term "arylalkynyl" as used herein includes an alkynyl group which has an aromatic group as a substituent. In addition, the arylalkynyl group may be optionally substituted with one or more substituents selected from OR, $NR_2$, SR, C(O)R, C(O)OR, $C(O)NR_2$, CN, $CF_3$, $NO_2$, $SO_2$, SOR, $SO_3R$, halo and cyclic-amino, wherein R is independently alkyl, alkenyl, alkynyl, alkylaryl, aryl, or cycloalkyl.

The term "alkylaryl" as used herein includes an alkyl group which has an aromatic group as a substituent. In addition, the alkylaryl group may be optionally substituted with one or more substituents selected from OR, $NR_2$, SR, C(O)R, C(O)OR, $C(O)NR_2$, CN, $CF_3$, $NO_2$, $SO_2$, SOR, $SO_3R$, halo and cyclic-amino, wherein R is independently alkyl, alkenyl, alkynyl, alkylaryl, aryl, or cycloalkyl.

Preferred alkyl groups are $C_1$ through $C_{18}$ alkyls. Similarly $C_1$ through $C_{18}$ alkoxy and aryl groups are preferred. $C_1$ through $C_{18}$ heteroaryl, alkylamino, arylamino, alkylsulfido, arylsulfido, alkylphosphino or arylphosphino groups are preferable.

Aryl alone or in combination includes carbocyclic aromatic systems. The systems may contain one, two or three rings wherein each ring may be attached together in a pendent manner or may be fused. Preferably the rings are 5- or 6-membered rings. Aryl groups include, but are not exclusive to, aryl having between 6 and 24, preferably between 6 and 18, more preferably between 6 and 16, even more preferably between 6 and 10 carbon atoms, comprising 1, 2, 3 or 4 aromatic rings, bound by means of a carbon-carbon bond or fused, such as phenyl, biphenyl, naphthyl, substituted phenyl, substituted biphenyl or substituted naphthyl, and may include carbocyclic or heterocyclic, monocyclic or fused or non-fused polycyclic aryl such as phenyl, naphthyl, pyrrolyl, indolyl, furanyl, thiophenyl, imidazolyl, oxazolyl, isoxazolyl, thiazolyl, triazolyl, tetrazolyl, pyrazolyl, pyridinyl, quinolinyl, isoquinolinyl, acridinyl, pyrazinyl, pyridazinyl, pyrimidinyl, benzimidazolyl, benzothiophenyl or benzofuranyl.

Heteroaryl alone or in combination includes heterocyclic aromatic systems. The systems may contain one, two or three rings wherein each ring may be attached together in a pendent manner or may be fused. Preferably the rings are 5- or 6-membered rings.

Heterocyclic and heterocycle refer to a 3 to 7-membered ring containing at least one heteroatom. This includes aromatic rings including but not limited to pyridine, thiophene, furan, pyrazole, imidazole, oxazole, isoxazole, thiazole, isothiazole, pyrrole, pyrazine, pyridazine, pyrimidine, benzimidazole, benzofuran, benzothiazole, indole, naphthalene, triazole, tetrazole, pyran, thiapyran, oxadiazole, triazine, tetrazine, carbazole, dibenzothiophene, dibenzofuran, indole, fluorine, and non-aromatic rings including but not limited to piperazine, piperidine, and pyrrolidine. The groups of the present invention can be substituted or unsubstituted. Preferred substituents include but are not limited to alkyl, alkoxy, aryl.

Heteroatom refers to S, O, N, P.

"Substituted" as used herein to describe a compound or chemical moiety refers to substitution with at least one hydrogen atom of that compound or chemical moiety being replaced by a second chemical moiety and it may refer to any level of substitution although mono-, di- and tri-substitutions are preferred. Non-limiting examples of substituents are those found in the exemplary compounds and embodiments disclosed herein, as well as halogen; alkyl; heteroalkyl; alkenyl; alkynyl; aryl; heteroaryl; hydroxy; alkoxyl; amino; nitro; thiol; thioether; imine; cyano; amido; phosphonato; phosphine; carboxyl; thiocarbonyl; sulfonyl; sulfonamide; ketone; aldehyde; ester; oxo; haloalkyl (e.g., trifluoromethyl); carbocyclic cycloalkyl, which can be monocyclic or fused or non-fused polycyclic (e.g., cyclopropyl, cyclobutyl, cyclopentyl or cyclohexyl) or a heterocycloalkyl, which can be monocyclic or fused or non-fused polycyclic (e.g., pyrrolidinyl, piperidinyl, piperazinyl, morpholinyl or thiazinyl); carbocyclic or heterocyclic, monocyclic or fused or non-fused polycyclic aryl (e.g., phenyl, naphthyl, pyrrolyl, indolyl, furanyl, thiophenyl, imidazolyl, oxazolyl, isoxazolyl, thiazolyl, triazolyl, tetrazolyl, pyrazolyl, pyridinyl, quinolinyl, isoquinolinyl, acridinyl, pyrazinyl, pyridazinyl, pyrimidinyl, benzimidazolyl, benzothiophenyl or benzofuranyl); amino (primary, secondary or tertiary); o-lower alkyl; o-aryl, aryl; aryl-lower alkyl;

—CO₂CH₃; —CONH₂; —OCH₂CONH₂; —NH₂; —SO₂NH₂; —OCHF₂; —CF₃; —OCF₃; —NH(alkyl); —N(alkyl)₂; —NH(aryl); —N(alkyl)(aryl); —N(aryl)₂; —CHO; —CO(alkyl); —CO(aryl); —CO₂(alkyl); and —CO₂(aryl); and such moieties can also be optionally substituted by a fused-ring structure or bridge, for example —OCH₂O—. These substituents can optionally be further substituted with a substituent selected from such groups. All chemical groups disclosed herein can be substituted, unless it is specified otherwise. For example, "substituted" alkyl, alkenyl, alkynyl, aryl, hydrocarbyl or heterocyclic moieties described herein are moieties which are substituted with a hydrocarbyl moiety, a substituted hydrocarbyl moiety, a heteroatom, or a heterocyclic moiety. Further, substituents may include moieties in which a carbon atom is substituted with a heteroatom such as nitrogen, oxygen, silicon, phosphorus, boron, sulfur, or a halogen atom. These substituents may include halogen, heterocycle, alkoxy, alkenoxy, alkynoxy, aryloxy, hydroxy, protected hydroxy, keto, acyl, acyloxy, nitro, amino, amido, cyano, thiol, ketals, acetals, esters and ethers.

Cyclometalated ligand is a term well known in the art and includes but is not limited to 2,6-diphenylpyridine (C^N^C), 2,6-bis(4-tert-butylphenyl)pyridine ($^t$BuC^N^C$^t$Bu), 2,6-diphenyl-4-(2,5-difluorophenyl)pyridine (2,5-F₂—C₆H₃-C^N^C), 2,6-diphenyl-4-p-tolylpyridine (C^NTol^C), 2,6-diphenyl-4-phenylpyridine (C^NPh^C), 2,6-bis(4-fluorophenyl)pyridine (FC^N^CF), 2,6-diphenyl-4-(4-isopropylphenyl)pyridine (4-$^i$Pr-Ph-C^N^C), 2,6-diphenyl-4-(4-nitrophenyl)pyridine (4-NO₂-Ph-C^N^C), 2,6-diphenyl-4-(4-methoxyphenyl)pyridine (4-OMe-Ph-C^N^C), 2,6-diphenyl-4-(4-methylphenyl)pyridine (4-Me-Ph-C^N^C), 2,6-diphenyl-4-(4-ethylphenyl)-pyridine (4-Et-Ph-C^N^C), 2,6-diphenyl-4-(2,3,4-trimethoxyphenyl)pyridine (2,3,4-OMe₃-Ph-C^N^C), 2,6-bis(4-methoxyphenyl)-4-(4-nitrophenyl)pyridine (4-NO₂-Ph-MeOC^N^-COMe), 2,6-bis(2,4-dichlorophenyl)-4-(4-isopropylphenyl)-pyridine (4-$^i$Pr-Ph-Cl₂C^N^CCl₂), 2,6-diphenyl-4-(4-tosylphenyl)pyridine (4-OTs-Ph-C^N^C), 2,6-diphenyl-4-(4-dimethylaminophenyl)pyridine (4-NMe₂-Ph-C^N^C), 2,6-diphenyl-4-(4-diphenylaminophenyl)pyridine (4-NPh₂-Ph-C^N^C), 2,6-diphenyl-4-(4-bromophenyl)pyridine (4-Br-Ph-C^N^C), 2,6-diphenyl-4-(4-chlorophenyl)pyridine (4-Cl-Ph-C^N^C), 2,6-diphenyl-4-(4-flurophenyl)pyridine (4-F-Ph-C^N^C), 2,6-diphenyl-4-(4-iodophenyl)pyridine (4-I-Ph-C^N^C), 2,6-diphenyl-4-(2,5-dimethylphenyl)pyridine (2,5-Me₂-Ph-C^N^C), 2,6-diphenyl-4-(2,3,4,5,6-pentafluorophenyl)pyridine (2,3,4,5,6-F₅-Ph-C^N^C), 2-(4-tert-butylphenyl)-6-(3,5-difluorophenyl)pyridine (3,5-F-Ph-C^NPh^C$^t$Bu), (2-(4-tert-butylphenyl)-6-(3,5-difluorophenyl)-4-phenylpyridine 3,5-F-Ph-C^N^C$^t$Bu), 1,3-diphenylisoquinoline (dpiq), 1,3-bis(4-fluorophenyl)isoquinoline (4-FC^N{C₉H₅}^CF-4), 1,3-bis(4-tert-butylphenyl)isoquinoline (Au{$^t$BuC^N(C₉H₅)^C$^t$Bu), 6-fluoro-1,3-diphenylisoquinoline (C^N(6-FC₉H₄)^C), 5-fluoro-1,3-diphenyl-isoquinoline (C^N(5-FC₉H₄)^C), 5-fluoro-1,3-bis(4-fluorophenyl)isoquinoline (4-FC^N(5F—C₉H₄)^CF-4) and 1,3-bis(4-tert-butylphenyl)-5-(2-isoquinolyl)benzene ($^t$BuC^C(4-$^t$BuC₆H₄)^N$_{(2\text{-}isoquinoline)}$).

Benzene includes substituted or unsubstituted benzene.
Pyridine includes substituted or unsubstituted pyridine.
Thiophene includes substituted or unsubstituted thiophene.
Furan includes substituted or unsubstituted furan.
Pyrazole includes substituted or unsubstituted pyrazole.
Imidazole includes substituted or unsubstituted imidazole.
Oxazole includes substituted or unsubstituted oxazole.
Isoxazole includes substituted or unsubstituted isoxazole.
Thiazole includes substituted or unsubstituted thiazole.
Isothiazole includes substituted or unsubstituted isothiazole.
Pyrrole includes substituted or unsubstituted pyrrole.
Pyrazine includes substituted or unsubstituted pyrazine.
Pyridazine includes substituted or unsubstituted pyridazine.
Pyrimidine includes substituted or unsubstituted pyrimidine.
Benzimidazole includes substituted or unsubstituted benzimidazole.
Benzofuran includes substituted or unsubstituted benzofuran.
Benzothiazole includes substituted or unsubstituted benzothiazole.
Indole includes substituted or unsubstituted indole.
Naphthalene includes substituted or unsubstituted naphthalene.
Triazole includes substituted or unsubstituted triazole.
Tetrazole includes substituted or unsubstituted tetrazole.
Pyran includes substituted or unsubstituted pyran.
Thiapyran includes substituted or unsubstituted thiapyran.
Oxadiazole includes substituted or unsubstituted oxadiazole.
Triazine includes substituted or unsubstituted triazine.
Tetrazine includes substituted or unsubstituted tetrazine.
Carbazole includes substituted or unsubstituted carbazole.
Dibenzothiophene includes substituted or unsubstituted dibenzothiophene.
Dibenzofuran includes substituted or unsubstituted dibenzofuran.
Piperazine includes substituted or unsubstituted piperazine.
Piperidine includes substituted or unsubstituted piperidine.
Pyrrolidine includes substituted or unsubstituted pyrrolidine.

The present invention will be illustrated more specifically by the following non-limiting examples, it is to be understood that changes and variations can be made therein without deviating from the scope and the spirit of the invention as hereinafter claimed. It is also understood that various theories as to why the invention works are not intended to be limiting. The luminescent gold(III) complexes of structure (I) have been represented throughout by their monomeric structure. As is well known to those in the art, the compounds may also be present as dimers, trimers or dendrimers.

In other embodiments of the invention, the luminescent gold(III) compounds of structure (I) are prepared in high purity. The synthetic method involves reacting a tridentate ligand-containing gold(III) chloride with the corresponding arylboronic acid (derivatives) under palladium-catalyzed reaction condition. This reaction is carried out under a mild condition. Purification can be carried out by any method or combination of methods, including chromatography, extraction, crystallization, sublimation or any combination thereof.

Figure 3:
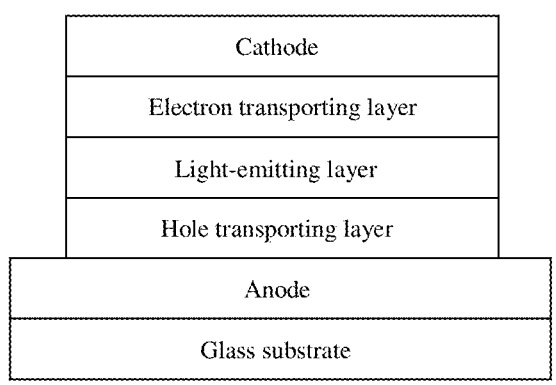
FIG. 3 is a schematic diagram of the basic structure of an organic EL device.

The luminescent gold(III) complexes can be used to form thin films by spin-coating, ink-jet printing, vacuum-deposition, or other known fabrication methods that can be applied in OLEDs. Referring to FIG. 3, an organic EL device has, in order, substrate, hole-injecting anode, hole transporting layer, light-emitting layer, electron transporting layer, and electron-injecting cathode.

Substrate is electrically insulated and can be either optically transparent, and comprises glass, plastic foil, or other appropriate material, or alternatively, may be opaque and comprises one or more semiconducting materials or ceramics. In one embodiment of the invention, the EL emission is viewed through substrate, or through both sides of the device, and substrate comprises a transparent glass substrate or a plastic foil. In other embodiments, the EL emission is viewed only through the top electrode, and substrate comprises an opaque semiconductor or ceramic wafers. Hole-injecting anode injects holes into the organic EL layer when anode is positively biased. Anode is composed of a conductive and optionally transmissive layer. In one embodiment of the invention, viewing the EL emission through the substrate is desirable, and hole-injecting anode is transparent. In other embodiments, the EL emission is viewed through the top electrode and the transmissive characteristics of anode are immaterial, and therefore any appropriate materials including metals or metal compounds having a work function of greater than 4.1 eV are used. Appropriate metals include gold, iridium, molybdenum, palladium, and platinum. In some embodiments, anode is transmissive, and suitable materials are metal oxides, including indium-tin oxide, aluminum- or indium-doped zinc oxide, tin oxide, magnesium-indium oxide, nickel-tungsten oxide, and cadmium-tin oxide. The preferred metals and metal oxides can be deposited by evaporation, sputtering, laser ablation, and chemical vapor deposition. Suitable materials for hole-transporting layer include polycyclic aromatic compounds, for example, 4,4'-bis[N-(1-naphthyl)-N-phenylamino]biphenyl (NPB), 4,4'-bis[N-(3-methylphenyl)-N-phenylamino]biphenyl (TPD), 4,4',4''-tris[(3-methylphenyl)phenylamino] triphenylamine (MTDATA), and di-[4-(N,N-ditolyl-amino)phenyl]cyclohexane (TAPC). In addition, polymeric hole-transporting materials can be used including poly(N-vinylcarbazole) (PVK), polythiophene, polypyrrole, polyaniline, and copolymers including poly(3,4-ethylenedioxythiophene):poly(4-styrene-surlfonate) (PEDOT:PSS).

Light-emitting layer in FIG. 3 is formed by doping the phosphorescent gold(III) metal complex as a dopant into a host compound. Suitable host materials should be selected so that the triplet exciton can be transferred efficiently from the host material to the phosphorescent dopant material. Suitable host materials include certain aryl amines, triazoles and carbazole compounds. Examples of desirable hosts are 4,4'-bis(carbazol-9-yl)biphenyl (CBP), MCP, 4,4',4''-tris (carbazol-9-yl)-triphenylamine (TCTA), 3-(4-biphenylyl)-4-phenyl-5-tert-butylphenyl-1,2,butylphenyl-1,2,4-triazole (TAZ), p-bis(triphenylsilyl)benzene (UGH2), diphenyl-4-triphenylsilylphenyl-phosphine oxide (TSPO1), PYD-2Cz and PVK.

Electron-transporting layer consists of materials or mixtures of materials having a high ionization potential and wide optical band gap. Suitable electron-transporting materials include 1,3,5-tris(phenyl-2-benzimidazolyl)-benzene (TPBI), 1,3,5-tri[(3-pyridyl)-phen-3-yl]benzene (TMPyPB), bathocuproine (BCP), bathophenanthroline (BPhen) and bis (2-methyl-8-quinolinolate)-4-(phenylphenolate)-aluminum (BAlq), tris-[2,4,6-trimethyl-3-(pyridin-3-yl)phenyl]borane (3TPYMB), 1,3,5-tri[(3-pyridyl)-phen-3-yl]benzene (TmPyPB), 1,3-bis[3,5-di(pyridin-3-yl)-phenyl]benzene (BmPyPhB) and 1,3,5-tris(6-(3-(pyridin-3-yl)phenyl)pyridin-2-yl)benzene (Tm3PyP26PyB). In one embodiment of the invention, electron transporting layer is prepared as an organic film by thermal evaporation, spin-coating, ink-jet printing from a solution, or other known fabrication methods. Electron-injecting cathode acts as a transmissive electron injector that injects electrons into the organic EL layer of anode when cathode is negatively biased. Cathode comprises a thin fluoride layer (which may be omitted) and a metal or metal alloy, preferably having a work function of less than 4 eV. Suitable materials include Mg:Ag, Ca, Li:Al, Al.

In some embodiments of the invention, novel luminescent gold(III) complexes are either the primary luminescent material or a secondary luminescent material in device. In one embodiment the gold(III) complex is employed as electrophosphorescent dopants in the multilayer solution-processable OLEDs with EQE of 5.9%. In another embodiment, the gold(III) complex is employed as electrophosphorescent dopants in the multilayer vacuum-deposited OLEDs with EQE of 14.7%. Advantageously, the gold(III) compounds can be deposited in the OLEDs by both spin-coating technique or vacuum deposition. In addition, the excellent solubility of these luminescent gold(III) complexes in a variety of organic solvents permits simple and economic manufacturing and patterning of large-area displays.

In general, emissive layer is sandwiched between hole-transporting layer and electron-transporting layer. To ensure an efficient exothermic energy transfer between the host material and the dopant material, the triplet energy of the host material must be larger than that of the dopant material. In addition, both the ionization potential and the electron affinity of the host material should be larger than those of the dopant material in order to achieve efficient Föster energy transfer from the host to the dopant. In order to confine triplet excitons within emissive layer, the triplet energy of hole-transporting material and electron-transporting material should be larger than that of the dopant material.

Example 1

General Synthetic Methodology

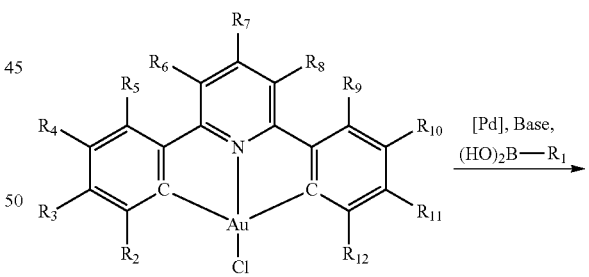

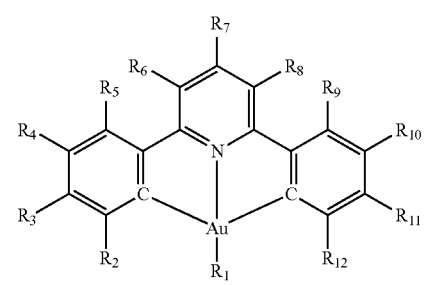

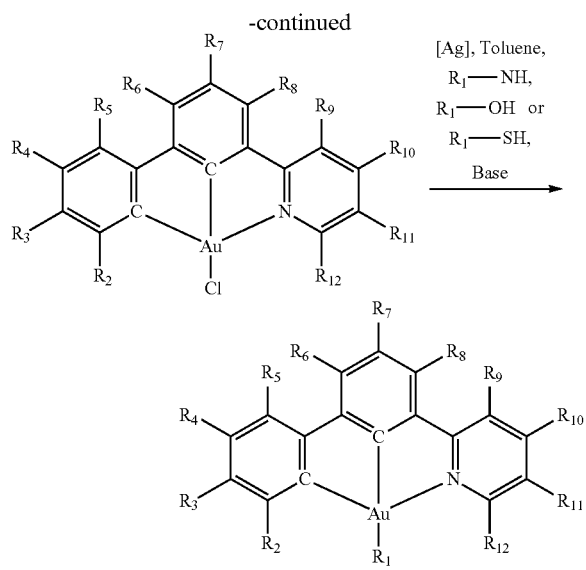

wherein:
(a) R$_1$ is selected from, but not limited to, aryl, substituted aryl, heteroaryl, substituted heteroaryl, heterocyclic aryl and substituted heterocyclic aryl, alkoxy, aryloxy, amide, thiolate, sulfonate, phosphide, fluoride, chloride, bromide, iodide, cyanate, thiocyanate or cyanide.
(b) R$_2$-R$_{12}$ groups are each independently selected from, but not limited to, hydrogen, alkyl, alkenyl, alkynyl, alkylaryl, aryl and cycloalkyl with one or more alkyl, alkenyl, alkynyl, alkylaryl, cycloalkyl, OR, NR$_2$, SR, C(O)R, C(O)OR, C(O)NR$_2$, CN, CF$_3$, NO$_2$, SO$_2$, SOR, SO$_3$R, halo, aryl, substituted aryl, heteroaryl, substituted heteroaryl or a heterocyclic group, wherein R is independently alkyl, alkynyl, alkylaryl, aryl or cycloalkyl.

Synthesis and Characterization

The tridentate ligands, 3,5-F$_2$-C^NPh^C$^t$Bu, 3,5-F$_2$-C^N^C$^t$Bu, dpiq, 4-CN—C^N(4-$^t$BuC$_6$H$_4$)^C$^t$Bu-4, 3,5-F$_2$-C^N(4-$^t$BuC$_6$H$_4$)^C$^t$Bu-4, 3,5-F$_2$-C^N(4-$^t$BuC$_6$H$_4$)^C—F-4, 3,5-F$_2$-C^N(4-$^t$BuC$_6$H$_4$)^C—F$_2$-3,5, 3,5-F$_2$-C^N(4-$^t$BuC$_6$H$_4$)^C—CF$_3$-4, 4-CF$_3$-C^N(4-$^t$BuC$_6$H$_4$)^C—CF$_3$-4, 4-OCF$_3$-C^N(4-$^t$BuC$_6$H$_4$)^C—OCF$_3$-4, $^t$BuC^C(4-$^t$BuC$_6$H$_4$)^N$_{(pyridine)}$, $^t$BuC^C(4-$^t$BuC$_6$H$_4$)^N$_{(2-isoquinoline)}$ and the gold(III) precursor complexes, [Au(3,5-F$_2$-C^NPh^C$^t$Bu)Cl], [Au(3,5-F$_2$-C^N^C$^t$Bu)Cl][Au{4-CN—C^N(4-$^t$BuC$_6$H$_4$)^C$^t$Bu-4}Cl], [Au{3,5-F$_2$-C^N(4-$^t$BuC$_6$H$_4$)^C$^t$Bu-4}Cl], [Au{3,5-F$_2$—CN(4-$^t$BuC$_6$H$_4$)C—F-4}Cl], [Au{3,5-F$_2$-C^N(4-$^t$BuC$_6$H$_4$)^C—F$_2$-3,5}Cl], [Au{3,5-F$_2$-C^N(4-$^t$BuC$_6$H$_4$)^C—CF$_3$-4}Cl], [Au{4-CF$_3$—CN(4-$^t$BuC$_6$H$_4$)C—CF$_3$-4}Cl], [Au{4-OCF$_3$-C^N(4-$^t$BuC$_6$H$_4$)^C—OCF$_3$-4}Cl], [Au(dpiq)Cl], [Au($^t$BuC^C(4-$^t$BuC$_6$H$_4$)^N$_{(pyridine)}$)Cl] and [Au($^t$BuC^C(4-$^t$BuC$_6$H$_4$)^N$_{(2-isoquinoline)}$)Cl] respectively, were prepared according to modification of a procedure reported in the literature [Kröhnke, F. *Synthesis* 1 (1976); Wong, K. H.; Cheung, K. K.; Chan, M. C. W.; Che, C. M. *Organometallics* 17, 5305 (1998)]. The target compounds were synthesized by the reaction of the respective gold(III) precursor complexes with the corresponding arylboronic acids in the presence of a catalytic amount of palladium(II) catalyst in base and organic solvent. For example, compound 1 was synthesized by stirring a mixture of [Au(3,5-F$_2$-C^N^C$^t$Bu)Cl](0.35 g, 0.63 mmol), K$_2$CO$_3$ (0.134 mg, 0.97 mmol), triphenylphosphine (16 mg, 0.06 mmol), Pd(OAc)$_2$ (0.72 g, 0.06 mmol) and 4-tert-phenylboronic acid (0.34 g, 1.89 mmol) in 30 mL degassed toluene and H$_2$O (4:1, v/v) at 60° C. for 12 hours under a nitrogen atmosphere. After removing the solvent, the crude product was purified by column chromatography on silica gel using chloroform as the eluent. Column fractions containing the product were combined and evaporated to dryness under reduced pressure. The residue was dissolved in dichloromethane. Subsequent recrystallization by diffusion of diethyl ether vapor into the dichloromethane solution of the product (35 mL) gave compound 1 (60 mg) as a pale white solid. Compounds 2 through 14 were synthesized from their respective precursors using the general synthetic methodologies as shown in example 1. $^1$H NMR spectra were recorded on a Bruker AVANCE 400 (400 MHz) Fourier-transform NMR spectrometer with chemical shifts reported relative to tetramethylsilane. Positive FAB mass spectra were recorded on a Thermo Scientific DFS High resolution Magnetic Sector Mass Spectrometer. Electrospray ionization (ESI) mass spectra were recorded on a Finnigan LCQ mass spectrometer. The results of the analyses confirm the high purity of all compounds 1-14.

The characterization data of compounds 1-14 are as follows:

Compound 1: [Au(3,5-F$_2$-C^N^C$^t$Bu)(C$_6$H$_4$—C(CH$_3$)$_3$-p)]. Yield: 60 mg, 29%. $^1$H NMR (400 MHz, CD$_3$Cl, 298 K, relative to Me$_4$Si, δ/ppm): δ 1.16 (s, 9H), 1.36 (s, 9H), 6.65-6.69 (m, 1H), 7.02 (d, J=2.0 Hz, 1H), 7.06 (dd, J=9.0 Hz and 2.0 Hz, 1H), 7.19 (dd, J=9.0 Hz and 2.0 Hz, 1H), 7.28 (d, J=8.4 Hz, 2H), 7.36 (d, J=8.0 Hz, 1H), 7.43 (t, J=8.4 Hz, 2H), 7.52 (d, J=8.0 Hz, 2H), 7.78 (t, J=8.0 Hz, 1H). Positive FAB-MS: m/z 651.8 [M]$^+$.

Compound 2: [Au(3,5-F$_2$-C^NPh^C$^t$Bu)(C$_6$H$_4$—C(CH$_3$)$_3$-p)]. Yield: 380 mg, 34%. $^1$H NMR (400 MHz, CD$_2$Cl$_2$, 298 K, relative to Me$_4$Si, δ/ppm): δ 1.17 (s, 9H), 1.39 (s, 9H), 6.74-6.79 (m, 1H), 7.02 (d, J=2.0 Hz, 1H), 7.27-7.34 (m, 3H), 7.35 (dd, J=9.0 Hz and 2.0 Hz, 1H), 7.53 (d, J=8.4 Hz, 2H), 7.59-7.66 (m, 4H), 7.73 (d, J=2.0 Hz, 1H), 7.78-7.80 (m, 3H). Positive FAB-MS: m/z 727.9 [M]$^+$.

Compound 3: [Au(3,5-F$_2$-C^NPh^C$^t$Bu)(C$_6$H$_4$-cbz-p)]. Yield: 20 mg, 17%. $^1$H NMR (400 MHz, CDCl$_3$, 298 K, relative to Me$_4$Si, δ/ppm): δ 1.25 (s, 9H), 6.78-6.82 (m, 1H), 7.24-7.32 (m, 5H), 7.42-7.47 (m, 6H), 7.57-7.65 (m, 5H), 7.67-7.76 (m, 3H), 7.88 (d, J=8.0 Hz, 2H), 8.15 (d, J=8.0 Hz, 2H). Positive FAB-MS: m/z 836.7 [M]$^+$.

Compound 4: [Au(dpiq)(C$_6$H$_4$—C(CH$_3$)$_3$-p)]. Yield: 60 mg, 32%. $^1$H NMR (400 MHz, CD$_2$Cl$_2$, 298 K, relative to Me$_4$Si, δ/ppm): δ 1.40 (s, 9H), 7.15-7.25 (m, 3H), 7.32-7.37 (m, 4H), 7.45 (dd, J=8.0 Hz and 1.4 Hz, 1H), 7.55-7.57 (m, 3H), 7.64-7.66 (m, 2H), 7.74 (s, 1H), 7.79 (d, J=8.0 Hz, 1H), 8.15 (d, J=8.0 Hz, 1H), 8.70 (d, J=8.0 Hz, 1H). Positive ESI-MS: m/z 690.5 [M]$^+$.

Compound 5: [Au{4-CN—C^N(4-$^t$BuC$_6$H$_4$)^C$^t$Bu-4}(C$_6$H$_4$—C(CH$_3$)$_3$-p)]. Yield: 53.6 mg, 34.2%. $^1$H NMR (500 MHz, THF-d$_8$, 298 K, δ/ppm): δ 8.09 (d, J=1.5 Hz, 1H), 8.05-8.03 (m, 2H), 7.87 (d, J=8.5 Hz, 2H), 7.79 (d, J=8.0 Hz, 1H), 7.65 (d, 1H, J=2.0 Hz), 7.62 (d, J=8.5 Hz, 2H), 7.56 (dd, J=8.0 and 2.0 Hz, 1H), 7.52 (d, J=8.5 Hz), 7.41 (d, J=2.0 Hz, 1H), 7.36 (d, J=8.5 Hz, 2H), 7.27 (dd, J=8.5 and 2.0 Hz, 1H), 1.40 (s, 9H, -$^t$Bu), 1.39 (s, 9H, -$^t$Bu), 1.23 (s, 9H, -$^t$Bu).

Compound 6: [Au{3,5-F$_2$-C^N(4-$^t$BuC$_6$H$_4$)^C$^t$Bu-4}(C$_6$H$_4$—C(CH$_3$)$_3$-p)]. Yield: 50 mg, 43.7%. $^1$H NMR (500 MHz, CDCl$_3$, 298 K, relative to Me$_4$Si, δ/ppm): δ 7.67-7.65 (m, 3H), 7.62 (s, 1H), 7.59-7.56 (m, 3H), 7.55-7.53 (d, J=8.0 Hz, 2H), 7.29-7.23 (m, 4H), 7.07-7.06 (m, 1H), 6.73-6.70 (m, 1H), 1.40 (s, 9H, -$^t$Bu), 1.38 (s, 9H, -$^t$Bu), 1.17 (s, 9H, -$^t$Bu).

Compound 7: [Au{3,5-F$_2$-C^N(4-$^t$BuC$_6$H$_4$)^C—F$_2$-3,5}(C$_6$H$_4$—C(CH$_3$)$_3$-p)]. Yield: 200 mg, 58%. $^1$H NMR (500 MHz, CD$_2$Cl$_2$, 298 K, δ/ppm): δ 7.76-7.68 (m, 5H), 7.61 (d, J=8.5 Hz, 2H), 7.45 (d, J=8.0 Hz, 2H), 7.30 (d, J=9.0 Hz, 1H), 7.26 (d, J=8.0 Hz, 2H), 6.92-6.89 (m, 1H), 6.79-6.77 (m, 1H), 6.73-6.68 (m, 1H), 1.40 (s, 9H), 1.38 (s, 9H, -$^t$Bu).

Compound 8: [Au{3,5-F$_2$-C^N(4-$^t$BuC$_6$H$_4$)^C—F-4}(C$_6$H$_4$—C(CH$_3$)$_3$-p)]. Yield: 80 mg, 42%. $^1$H NMR (500 MHz, Acetone-d$_6$, 298 K, δ/ppm): δ 8.38 (s, 2H), 8.03 (d, J=8.5 Hz, 2H), 7.81-7.79 (m, 2H), 7.67 (d, J=8.5 Hz, 2H), 7.44 (d, J=8.0 Hz, 2H), 7.16 (d, J=8.0 Hz, 2H), 6.82-6.65 (m, 2H), 1.41 (s, 9H, -$^t$Bu), 1.35 (s, 9H, -$^t$Bu).

Compound 9: [Au{3,5-F$_2$-C^N(4-$^t$BuC$_6$H$_4$)^C—CF$_3$-4}(C$_6$H$_4$—C(CH$_3$)$_3$-p)]. Yield: 400 mg, 47%. $^1$H NMR (500 MHz, CDCl$_3$, 298 K, relative to Me$_4$Si, δ/ppm): δ 7.76 (d, J=1.0 Hz, 1H), 7.73-7.70 (m, 2H), 7.64 (d, J=6.5 Hz, 2H), 7.59 (d, J=6.5 Hz, 2H), 7.46-7.44 (m, 3H), 7.35 (s, 1H), 7.27 (d, 2H, J=8.0 Hz), 7.23-7.21 (m, 1H), 6.71-6.68 (m, 1H), 1.41 (s, 9H), 1.38 (s, 9H, -$^t$Bu).

Compound 10: [Au{4-CF$_3$—C^N(4-$^t$BuC$_6$H$_4$)^C—CF$_3$-4}(C$_6$H$_4$—C(CH$_3$)$_3$-p)]. 110 mg, 44%. $^1$H NMR (500 MHz, CDCl$_3$, 298 K, relative to Me$_4$Si, δ/ppm): δ 7.76 (s, 2H of C^N^C), 7.72 (d, J=8.0 Hz, 2H), 7.67-7.66 (m, 2H), 7.62-7.57 (m, 4H), 7.47-7.45 (m, 4H), 7.35 (d, J=8.5 Hz, 2H), 1.42 (s, 18H, -$^t$Bu).

Compound 11: [Au{4-OCF$_3$—C^N(4-$^t$BuC$_6$H$_4$)^C—OCF$_3$-4} (C$_6$H$_4$—C(CH$_3$)$_3$-p)]. Yield: 320 mg, 48%. $^1$H NMR (500 MHz, CDCl$_3$, 298 K, relative to Me$_4$Si, δ/ppm): δ 7.58 (d, J=8.5 Hz, 2H), 7.55-7.50 (m, 6H), 7.38 (d, J=8.5 Hz, 2H), 7.31 (d, J=8.5 Hz, 2H), 7.18-7.17 (m, 2H), 6.98-6.96 (m, 2H), 1.40 (s, 9H, -$^t$Bu), 1.37 (s, 9H, -$^t$Bu).

Compound 12: [Au($^t$BuC^C(4-$^t$BuC$_6$H$_4$)^N$_{(pyridine)}$)(cbz)]. Yield: 125 mg, 56%. $^1$H NMR (500 MHz, CDCl$_3$, 298 K, relative to Me$_4$Si, δ/ppm) δ 8.25 (d, J=8.0 Hz, 2H), 8.12 (d, J=5.0 Hz, 1H), 7.98 (dd, J=6.0 and 1.0 Hz, 2H), 7.67-7.57 (m, 6H), 7.55 (dd, J=6.5 and 2.0 Hz, 1H), 7.35 (d, J=8.0 Hz, 2H), 7.30 (td, J=7.0 and 1.0 Hz, 1H), 7.20 (td, J=6.0 and 2.0 Hz, 1H), 7.16 (dd, J=8.0 and 2.0 Hz, 1H), 7.12 (td, J=7.0 and 1.0 Hz, 2H), 6.81 (d, J=2.0 Hz, 1H), 1.55 (s, 9H, -$^t$Bu), 1.41 (s, 9H, -$^t$Bu).

Compound 13: [Au($^t$BuC^C(4-$^t$BuC$_6$H$_4$)^N$_{(pyridine)}$)(SC$_6$H$_4$-Me-p)]. Yield: 135 mg, 85%. $^1$H NMR (400 MHz, CDCl$_3$, 298 K, relative to Me$_4$Si, δ/ppm) δ 8.96 (dd, J=4.7 and 0.6 Hz, 1H), 7.96 (td, J=7.6 and 1.6 Hz, 1H), 7.87 (d, J=8.1 Hz, 1H), 7.81 (d, J=1.8 Hz, 1H), 7.57 (d, J=8.2 Hz, 2H), 7.53-7.46 (m, 6H), 7.36-7.27 (m, 2H). 7.16 (dd, J=7.9 and 1.8 Hz, 1H), 6.90 (d, J=8.3 Hz, 2H), 2.23 (s, 3H), 1.39 (s, 9H, -$^t$Bu), 1.17 (s, 9H, -$^t$Bu).

Compound 14: [Au($^t$BuC^C(4-$^t$BuC$_6$H$_4$)^N$_{(2-isoquinoline)}$)(cbz)]. Yield: 81 mg, 57%. $^1$H NMR (600 MHz, CDCl$_3$, 298 K, relative to Me$_4$Si, δ/ppm) δ 8.60-8.58 (d, J=8.8 Hz, 1H), 8.51-8.49 (d, J=8.6 Hz, 1H), 8.28-8.27 (d, J=7.8 Hz, 2H), 8.17-8.15 (d, J=8.7 Hz, 1H), 7.80-7.77 (m, 2H), 7.66-7.62 (m, 4H), 7.59-7.55 (m, 3H), 7.38-7.35 (m, 1H), 7.27-7.24 (m, 3H), 7.13-7.10 (m, 3H), 7.04-7.02 (dd, J=7.9 and 1.9 Hz, 1H), 5.67 (d, J=1.8 Hz, 1H), 1.41 (s, 9H, -$^t$Bu), 0.70 (s, 9H, -$^t$Bu).

Example 2

UV-Vis Absorption Properties

Figure 4:
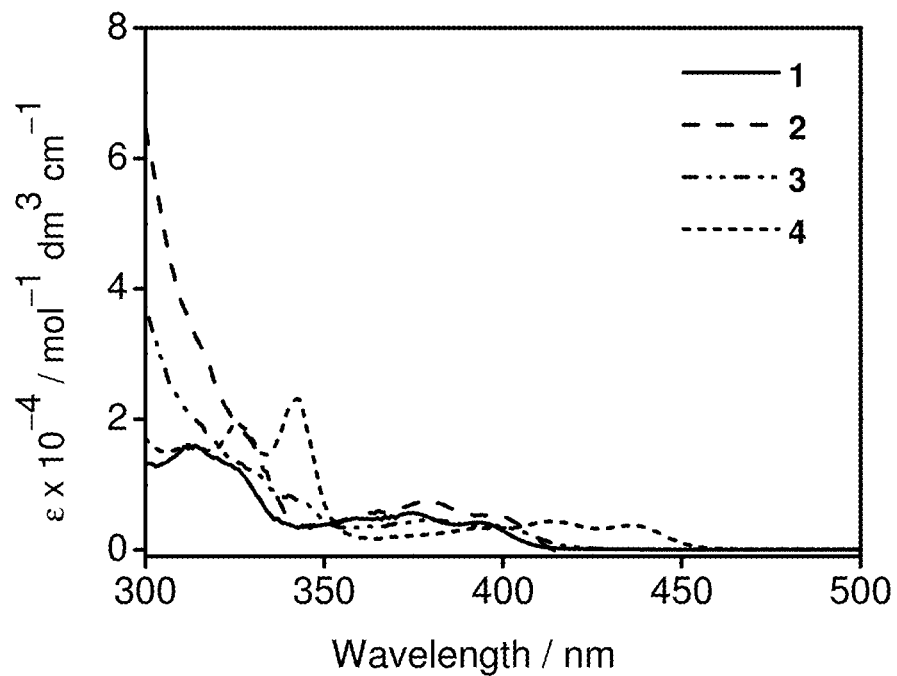
FIG. 4 shows the UV-vis absorption spectra of compounds 1-4 in dichloromethane at 298 K.

The UV-vis absorption spectra of compounds 1-14 have been measured in dichloromethane at 298 K. As shown in FIG. 4, the UV-vis absorption spectra of compounds 1-4 feature a moderately intense vibronic-structured absorption band at ca. 380-440 nm with extinction coefficients (ε) on the order of $10^4$ dm$^3$mol$^{-1}$cm$^{-1}$. This absorption band shows vibrational progressional spacings of ca. 1300 cm$^{-1}$, corresponding to the skeletal vibrational frequency of the cyclometalated tridentate ligands. Similar to our previously reported structurally related gold(III) complexes, this absorption band is tentatively assigned to a metal-perturbed IL π→π* transition of the cyclometalated tridentate ligands with charge transfer character from the aryl ring to the pyridine or quinolinyl unit. It is found that this intense vibronic-structured band has been red-shifted upon changing from pyridine moiety (compound 1) to quinolinyl moiety (compound 4) of the cyclometalated ligand. The fusion of an aryl moiety of compound 4 on the pyridine ring could stabilize the π* orbital by better delocalization over the tridentate ligand, giving rise to a narrowing of the π-π* energy gap and therefore a red shift in the absorption band. In addition, the assignment of a metal-to-ligand charge transfer transition would not be likely due to the non-reducing nature of the gold(III) center to achieve Au(IV) higher oxidation state. The UV-visible absorption data of compounds 1-14 in dichloromethane or toluene at 298 K have been summarized in Table 1. The UV-vis absorption and emissive spectra of compounds 1-14 provide the fundamental photophysical data that provide useful guidelines for the design of the chemical structures to tune the emission color of the emitters in both solution and solid state.

Example 3

Photoluminescence Properties

Figure 5:
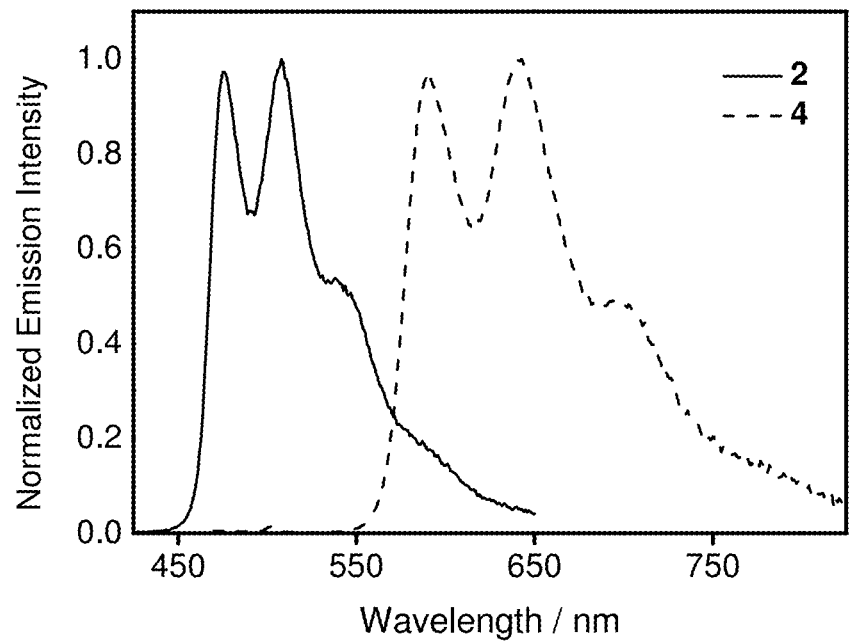
FIG. 5 shows the normalized emission spectra of compounds 2 and 4 in dichloromethane at 298 K. No instrumental correction was applied for the emission wavelength.
Figure 6:
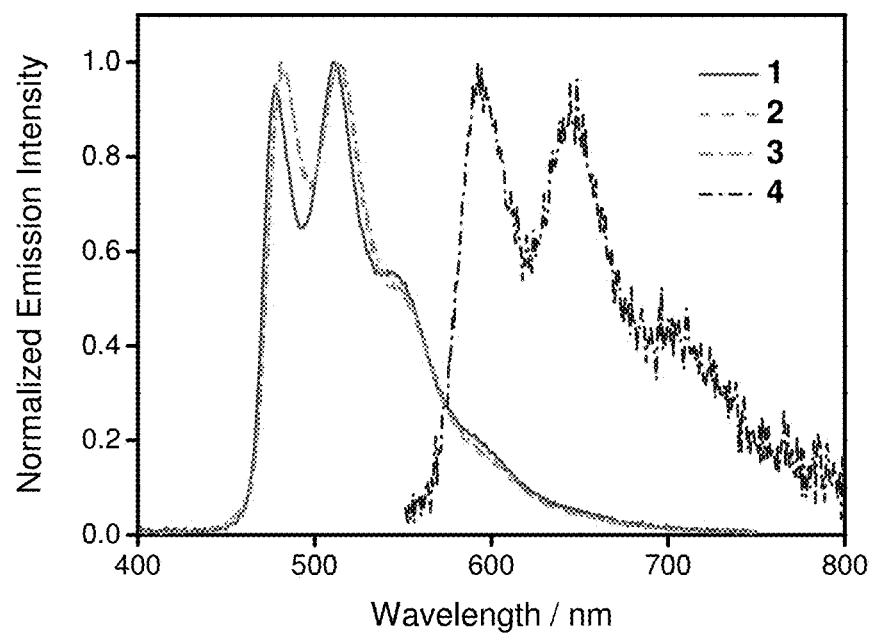
FIG. 6 shows the normalized photoluminescence spectra of thin films of 5 wt % of compounds 1-4 doped into MCP at 298 K. No instrumental correction was applied for the emission wavelength.

Unlike most other gold(III) compounds which are non-emissive or only show luminescence at low temperatures, compounds 1-14 display intense luminescence at 466-600 nm with respectable photoluminescence quantum yields in both solution and solid state thin-films at room temperature (Table 1). The emission spectra of compounds 2 and 4 are shown in FIG. 5. Upon excitation at λ=380 nm in dichloromethane solution at 298 K, vibronic-structured emission bands with peak maximum at ca. 470 nm for compounds 1-3 and 590 nm for compound 4 are observed. The vibrational progressional spacing of ca. 1300 cm$^{-1}$ matches well with the v(C⋯C) and v(C⋯N) stretching modes of the tridentate ligand, suggesting an assignment of a metal-perturbed $^3$IL [π→π*] state for the emission. These emission bands are assigned as originating from a metal-perturbed IL $^3$[π→π*] state of the tridentate ligand, probably mixed with a charge transfer character from the aryl ring to the pyridyl or quinolinyl moiety. The additional aryl moiety on the pyridine ring on the tridentate ligand of compound 2, or an additional carbazole unit on the auxiliary ligand on compound 3, does not alter the emission energy when compared to that of compound 1. In addition, in good agreement with the UV-vis absorption studies, a red-shifted emission band has been observed for compound 4 when compared to that of compound 1. The emission maximum is red-shifted from 470 nm to 590 nm, possibly due to the narrowing of the π-π* energy gap upon stabilization of the π* orbital by better delocalization over the tridentate ligand. FIG. 6 shows the normalized photoluminescence spectra of thin films of 5 wt % of compounds 1-4 doped into MCP at 298 K. The emission energies are similar to their emission energies in solution and show emission maxima at ca. 470 nm for compounds 1-3 and 590 nm for compound 4. These results imply that there is no significant spectral shift in the emission spectra, unlike most other platinum(II) and gold(III) systems. This allows one to precisely control the emission energies of this class of complexes via the modification of cyclometalated tridentate ligands in a predictable and controllable manner.

TABLE 1

Photophysical data for compounds 1-14

| Compound | Medium (T/K) | Absorption $\lambda_{max}$/nm ($\varepsilon_{max}$/dm$^3$mol$^{-1}$cm$^{-1}$) | Emission $\lambda_{max}$/nm ($\tau_o$/μs) | $\Phi_{sol}$[a],[b] | $\Phi_{film}$[c],[d] |
|---|---|---|---|---|---|
| 1 | CH$_2$Cl$_2$ (298) | 314 (16000), 330 (9320), 374 (5580), 394 (4055) | 470, 506, 544 (18.0) | 0.04[a] | 0.28[c] |
| 2 | CH$_2$Cl$_2$ (298) | 291 (43780), 330 (8140), 380 (3635), 400 (2535) | 476, 512, 550 (45.8) | 0.07[a] | 0.41[c] |
| 3 | CH$_2$Cl$_2$ (298) | 330 (12315), 380 (4620), 400 (3470) | 476, 512, 558 (9.0) | 0.13[a] | 0.37[c] |
| 4 | CH$_2$Cl$_2$ (298) | 326 (19390), 340 (22480), 414 (4370), 438 (3520) | 590, 640, 700 (9.8) | 4 × 10$^{-3}$[b] | 0.04[c] |
| 5 | CH$_2$Cl$_2$ (298) | 300 (42355), 365 (4115), 384 (5935), 404 (4640) | 492, 530, 570 (40.4) | 0.13 | 0.30[c] |
| 6 | CH$_2$Cl$_2$ (298) | 298 (32990), 358 (1980), 378 (3155), 398 (2290) | 474, 508, 546 (12.3) | 0.06 | 0.37[c] |
| 7 | CH$_2$Cl$_2$ (298) | 290 (31225), 304 (34390), 354 (2070), 374 (3530), 394 (2300) | 470, 504, 540 (14.0) | 0.10 | 0.30[c] |
| 8 | CH$_2$Cl$_2$ (298) | 290 (33580), 308 (38120), 330 (15790), 366 (3735), 386 (2430) | 466, 500, 538 (15.2) | 0.07 | 0.26[c] |
| 9 | CH$_2$Cl$_2$ (298) | 286 (32210), 308 (39285), 366 (4280), 386 (2845) | 466, 500, 538 (20.1) | 0.11 | 0.34[c] |
| 10 | CH$_2$Cl$_2$ (298) | 284 (8745), 306 (13040), 366 (1425), 386 (960) | 466, 500, 538 (17.5) | 0.10 | 0.30[c] |
| 11 | CH$_2$Cl$_2$ (298) | 290 (28285), 314 (21350), 360 (1915), 372 (2450), 392 (1795) | 466, 500, 538 (15.7) | 0.11 | 0.20[c] |
| 12 | Toluene (298) | 304 (28900), 344 (15720), 366 (8810), 390 (3080) | 564 (0.2) | 0.04 | 0.75[d] |
| 13 | Toluene (298) | 324 (18005), 340 (15905), 394 (4040) | 586 (<0.1) | 3 × 10$^{-3}$ | 0.34[d] |
| 14 | Toluene (298) | 417 (2570), 495 (2020) | 700 (0.2) | 7 × 10$^{-3}$ | 0.61[d] |

[a]The luminescence quantum yield, measured at room temperature using quinine sulfate in 0.5M H$_2$SO$_4$ as the reference (excitation wavelength = 365 nm, $\Phi_{lum}$ = 0.56)
[b]The luminescence quantum yield, measured at room temperature using [Ru(bpy)$_3$]Cl$_2$ in aqueous state as the reference (excitation wavelength = 436 nm, $\Phi_{lum}$ = 0.042)
[c]$\Phi_{film}$ of gold(III) compound doped into 5% MCP excited at wavelength of 320 nm
[d]$\Phi_{film}$ of gold(III) compound doped into 10% MCP excited at wavelength of 320 nm Example 4

A solution-processable OLED according to an embodiment of the invention was constructed in the following manner:

a) A transparent anode ITO-coated borosilicate glass substrate (38 mm×38 mm) with sheet resistance of 30Ω per square was ultrasonicated in the commercial detergent Decon 90, rinsed in deionized water having a resistivity of 18.2 mega-ohm for 15 minutes, and then dried in an oven at 120 degree C. for an hour. The substrate was next subjected to an UV-ozone treatment in a Jelight 42-220 UVO-Cleaner equipped with a mercury grid lamp for 15 minutes in order to increase the work function of the ITO-coated glass substrate for better hole injection into the organic layer.
b) A 70-nm thick PEDOT:PSS hole-transporting layer was spin-coated by using a Laurell WS-400Ez-6NPP-Lit2 single wafer spin processor at 7000 rpm for 30 seconds onto the ITO-coated glass substrate of step a and baked at 110 degree C. for 10 minutes in air.
c) A 60-nm thick light-emitting layer was spin-coated by using a Laurell WS-400Ez-6NPP-Lit2 single wafer spin processor at 6000 rpm for 25 seconds onto PEDOT:PSS layer of step b, and baked at 80 degree C. for 10 minutes in air, in which compound 2 was doped into light-emitting MCP layer at different concentrations in the range from 5 to 20%;
d) The substrate was put into a vacuum chamber, and the chamber was pumped down from 1 bar to 5×10$^{-6}$ mbar;
e) A 5 nm thick 3TPYMB hole blocking layer was deposited by thermal evaporation on doped MCP light-emitting layer of step c.
f) A 30 nm TmPyPB electron transporting layer was deposited by thermal evaporation on the 3TPYMB layer of step e.
g) A 0.8-nm thick LiF layer and a 80 nm thick Al layer were deposited by thermal evaporation on the TmPyPB layer of step f to form an electron-injecting cathode.

3TPYMB, TmPyPB, LiF and Al were prepared by thermal evaporation from tantalum boats by applying current through the tantalum boats. Deposition rates were monitored with a quartz oscillation crystal and a Sigma SQM-242 quartz crystal card and controlled at 0.1-0.2 nm s$^{-1}$ for both organic and metal layers. Current density-voltage-luminance characteristics of organic EL devices were measured with a programmable Keithley model 2420 power source and a Spectrascan PR 655 colorimeter under ambient air conditions.

Figure 7:
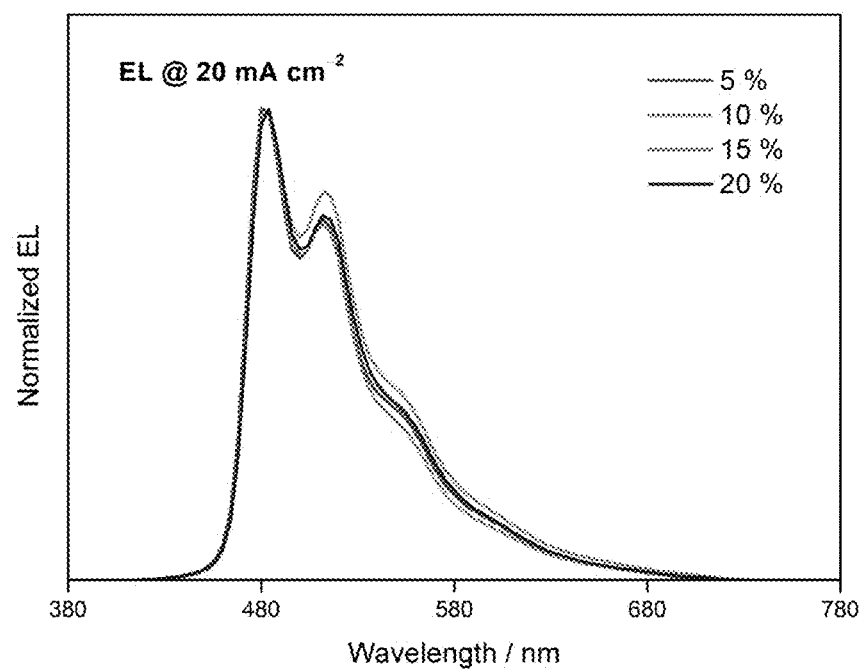
FIG. 7 shows the EL spectra of the solution-processable OLEDs with compound 2 doped into MCP as the light-emitting layer, in accordance with an embodiment of the present invention.
Figure 8:
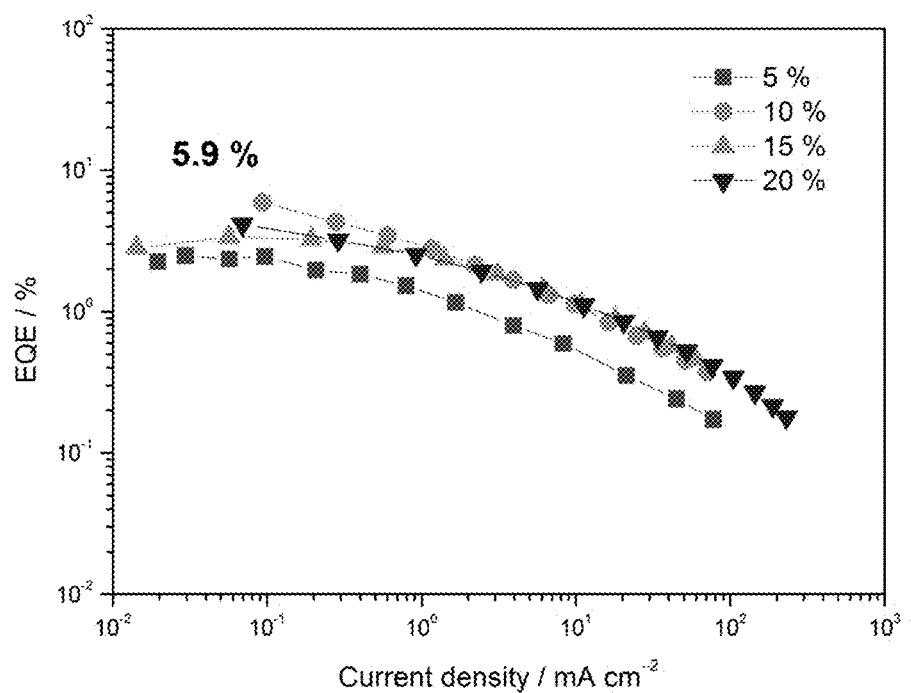
FIG. 8 shows the EQEs of the solution-processable OLEDs with compound 2 doped into MCP as the light-emitting layer, in accordance with an embodiment of the present invention.

As depicted in FIG. 7, all devices exhibit vibronic-structured emission, and the EL spectra for all the devices are almost identical to their emission spectra in solution and MCP doped thin films without any undesirable emission coming from the adjacent carrier-transporting layers or the host materials. Notably, no bathochromic shift is observed with increasing dopant concentrations. It is not the case for other square-planar metal complexes, including platinum(II) and gold(III) systems, in which the EL spectra are found to show significant spectral shifts upon dopant aggregation to give a broad red-shifted excimer emission. In addition, the optimized device doped with 10% compound 2 demonstrates a high EQE of 5.9%, as shown in FIG. 8.

Example 5

A vacuum-deposited OLED according to an embodiment of the invention was constructed in the following manner:
a) A transparent anode ITO-coated borosilicate glass substrate (38 mm×38 mm) with sheet resistance of 30Ω per square was ultrasonicated in the commercial detergent Decon 90, rinsed in deionized water having a resistivity of 18.2 mega-ohm for 15 minutes, and then dried in an oven at 120 degree C. for an hour. The substrate was next subjected to an UV-ozone treatment in a Jelight 42-220 UVO-Cleaner equipped with a mercury grid lamp for 15 minutes in order to increase the work function of the ITO-coated glass substrate for better hole injection into the organic layer.
b) The substrate was put into a vacuum chamber, and the chamber was pumped down from 1 bar to $5 \times 10^{-6}$ mbar;
c) A 2-nm thick molybdenum oxide ($MoO_3$) hole injecting layer was deposited by thermal evaporation onto the ITO-coated glass substrate of step a;
d) A 40-nm thick TAPC hole transporting layer was deposited by thermal evaporation onto the $MoO_3$ layer of step c;
e) A 25-nm thick light-emitting layer was deposited by thermal evaporation onto the TAPC layer of step d, in which 2, 5, 8, 11% of compound 2 was doped into light-emitting MCP layer;
f) A 5-nm thick TSPO1 hole-blocking layer was deposited by thermal evaporation onto the light-emitting layer of step e;
g) A 35-nm thick Tm3PyP26PyB electron-transporting layer was deposited by thermal evaporation on the TSPO1 layer of step f;
h) A 1-nm thick LiF layer and a 100-nm thick Al layer were deposited by thermal evaporation on Tm3PyP26PyB of step g to form an electron-injecting cathode.

All materials were prepared by thermal evaporation from tantalum boats by applying current through the tantalum boats. Deposition rates were monitored with a quartz oscillation crystal and a Sigma SQM-242 quartz crystal card and controlled at 0.1-0.2 nm $s^{-1}$ for both organic and metal layers. Current density-voltage-luminance characteristics of organic EL devices were measured with a programmable Keithley model 2420 power source and a Spectrascan PR 655 colorimeter under ambient air conditions.

Example 6

The same materials and processing procedures were employed as described in Example 5, except the MCP host was replaced by another host material with higher triplet energy, PYD-2Cz.

Figure 9:
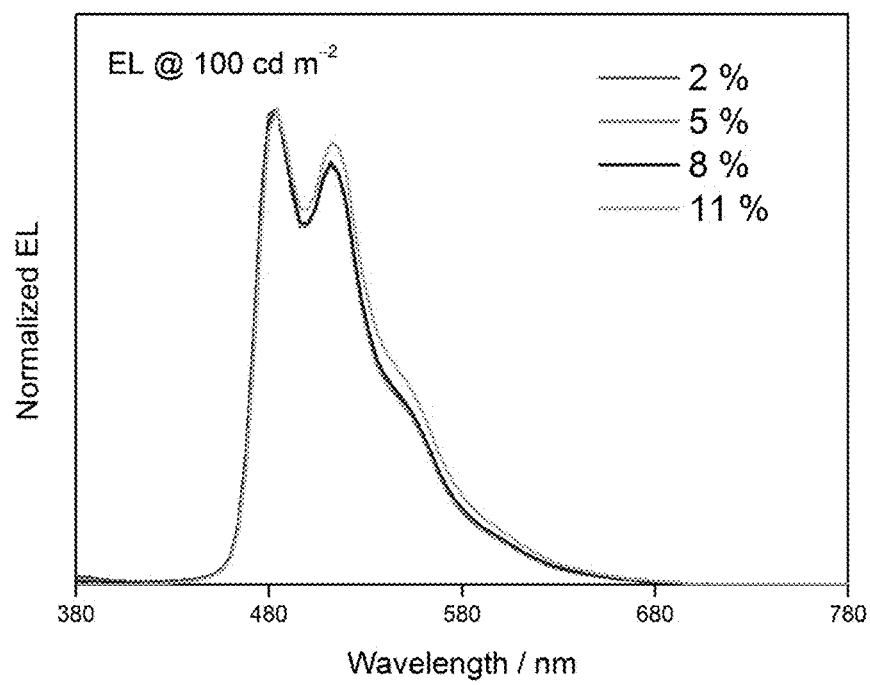
FIG. 9 shows the EL spectra of the vacuum-deposited OLEDs with compound 2 doped into MCP as the light-emitting layer, in accordance with an embodiment of the present invention.
Figure 10:
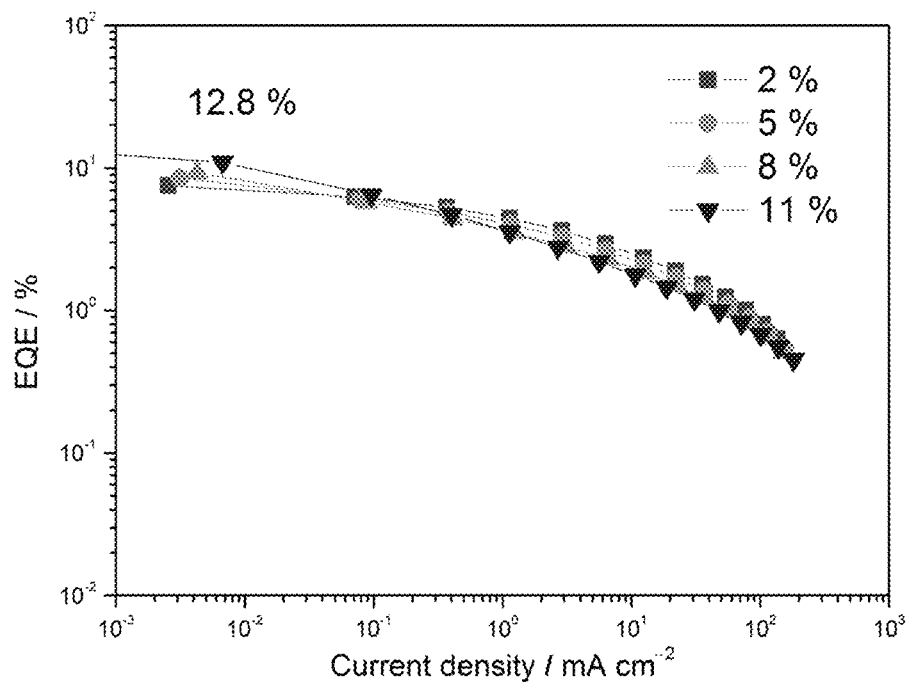
FIG. 10 shows the EQEs of the vacuum-deposited OLEDs with compound 2 doped into MCP as the light-emitting layer, in accordance with an embodiment of the present invention.
Figure 11:
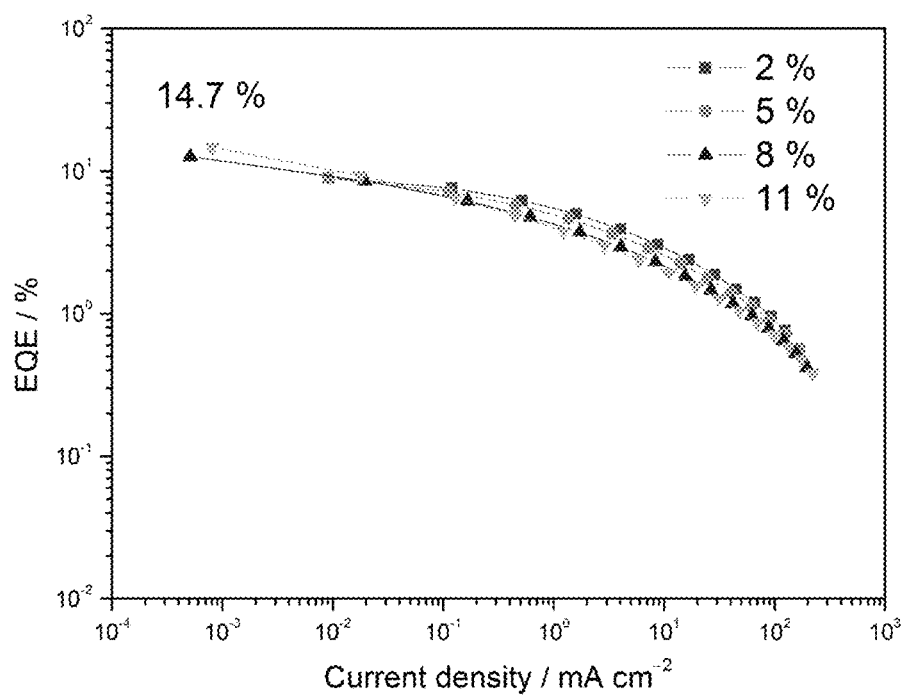
FIG. 11 shows the EQEs of the vacuum-deposited OLEDs with compound 2 doped into PYD-2Cz as the light-emitting layer, in accordance with an embodiment of the present invention.

Similar to the case of the solution-processable OLEDs, the vacuum-deposited devices made with 2 exhibit vibronic-structured emission with peak maxima at ca. 484 and 512 nm, with a shoulder at ca. 550 nm (FIG. 9). More importantly, high EQEs of up to 12.8% can be achieved for the optimized device doped with 11 wt % compound 2 (FIG. 10). The performance can be further boosted up to 41.5 cd $A^{-1}$, 43.7 lm $W^{-1}$ and 14.7% by using PYD-2Cz as host material (FIG. 11). These results definitely confirm the capability of the gold(III) compounds in the present invention as phosphorescent dopant in both vacuum-deposited and solution-processable OLEDs.

What is claimed:

1. A luminescent gold(III) compound having the chemical structure shown in formula (I),

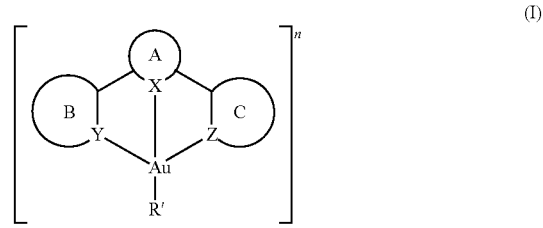

(a) wherein
(i) X is nitrogen, and Y and Z are carbon; wherein ring A is a cyclic structure of pyridine, quinoline, or isoquinoline; wherein the ring A is substituted by an aryl, a substituted aryl, a heteroaryl, a substituted heteroaryl, a heterocyclic aryl or a substituted heterocyclic aryl; and wherein the ring B and the ring C are independently cyclic structures of phenyl groups; or
(ii) X and Y are carbon, and Z is nitrogen; wherein the ring A and the ring B are cyclic structures of phenyl groups; wherein the ring A and the ring B are independently substituted by an aryl, a substituted aryl, a heteroaryl, a substituted heteroaryl, a heterocyclic aryl or a substituted heterocyclic aryl; and wherein the ring C is a cyclic structure of pyridine, quionline, or isoquinoline;
(b) wherein the ring B and the ring C are identical or non-identical, with the proviso that the ring B and the ring C are not both 4-tert-butylbenzene;
(c) wherein n is zero, a positive integer or a negative integer; and
(d) wherein R' is selected from the group consisting of: a heteroaryl, a substituted heteroaryl, a heterocyclic aryl, a substituted heterocyclic aryl, an alkyl, an alkoxy, an aryloxy, an amide, a thiolate, a sulfonate, a phosphide, fluoride, chloride, bromide, iodide, cyanate, thiocyanate, and 4-tert-butylphenyl, and a carbazole; wherein the ring A, the ring B, and the ring C are independently benzene or pyridine, or an aryl or pyridyl, or quinolyl, or isoquinolyl with one or more members selected from the group consisting of: alkyl, alkenyl, alkynyl, alkylaryl, cycloalkyl, OR, $NR_2$, SR, C(O)R, C(O)OR, $C(O)NR_2$, CN, $CF_3$, $NO_2$, $SO_2$, SOR, $SO_3R$, halo, aryl, substituted aryl, heteroaryl, substituted heteroaryl or heterocyclic group, wherein R is selected from the group consisting of: an alkyl, an alkenyl, an alkynyl, an alkyaryl, an aryl, or a cycloalkyl, wherein when the ring A is pyridine, the ring A is substituted with another member selected from the group consisting of: an aryl, a substituted aryl, a heteroaryl, a substituted heteroaryl, a heterocyclic aryl or a substituted heterocyclic aryl.

2. The gold(III) compound according to claim 1, wherein the gold(III) compound is selected from the following compounds (1) to (14):

25
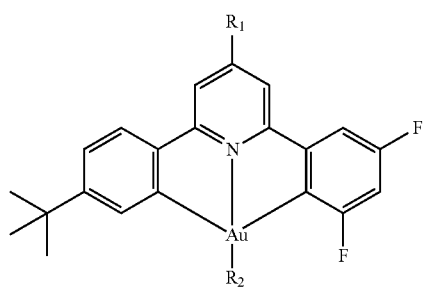
R₁=H; R₂=4-tert-butylphenyl (1)
R₁=Phenyl; R₂=4-tert-butylphenyl (2)
R₁=Phenyl; R₂=9-phenylcarbazole (3)
(4)
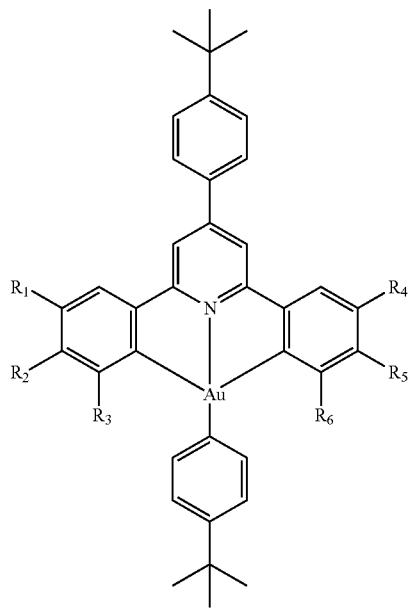
R₁=H; R₂=CN; R₃=H; R₄=H; R₅=t-butyl; R₆=H (5)
R₁=F; R₂=H; R₃=F; R₄=H; R₅=t-butyl; R₆=H (6)
R₁=F; R₂=H; R₃=F; R₄=H; R₅=F; R₆=H (7)
26
R₁=F; R₂=H; R₃=F; R₄=F; R₅=H; R₆=F (8)
R₁=F; R₂=H; R₃=F; R₄=H; R₅=CF₃; R₆=H (9)
R₁=H; R₂=CF₃; R₃=H; R₄=H; R₅=CF₃; R₆=H (10)
R₁=H; R₂=OCF₃; R₃=H; R₄=H; R₅=OCF₃; R₆=H (11)
(12)
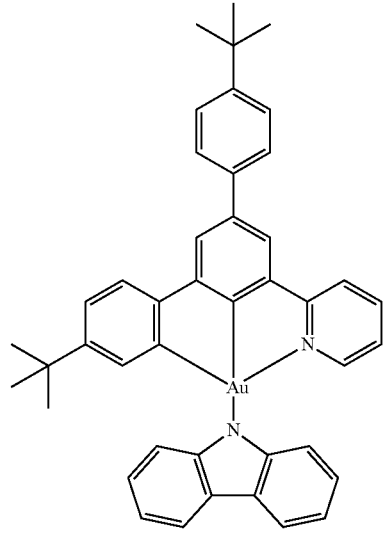
(13)

-continued (14)

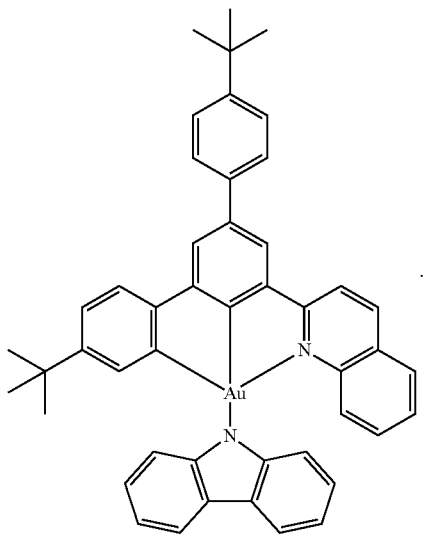

3. The gold(III) compound according to claim 1, wherein the gold(III) compound has photoluminescence properties within a range of 380 to 1050 nm.

4. A method for preparing a luminescent compound with a cyclometalated tridentate ligand and at least one monoaryl group coordinated to a gold(III) metal group, the method comprising performing the reaction:

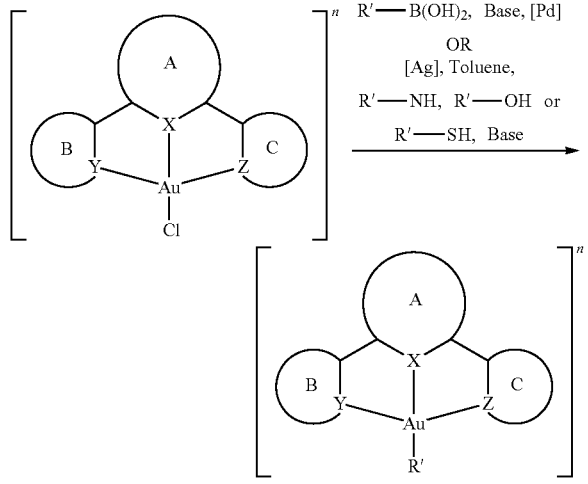

wherein:
R', X, Y, Z, ring A, ring B and ring C are as defined in claim 1.

5. The method according to claim 4, wherein the luminescent compound is a dopant included in a light-emitting layer of a light-emitting device.

6. The method for preparing the luminescent compound according to claim 4, further comprising:
purifying the luminescent compound by any combination of chromatography, extraction, crystallization, and sublimation.

7. A light-emitting device having an ordered structure comprising: an anode, a hole-transporting layer, a light-emitting layer, an electron-transporting layer, and a cathode, wherein the light-emitting layer comprises a luminescent compound prepared according to the method of claim 4.

8. The light-emitting device of claim 7, wherein the light-emitting layer is prepared using vacuum deposition or solution processing technique.

9. A light-emitting device with an ordered structure comprising: an anode; a hole-transporting layer; a light-emitting layer; an electron-transporting layer; and a cathode; wherein the light-emitting layer comprises a gold(III) compound having a chemical structure represented by the following formula (I),

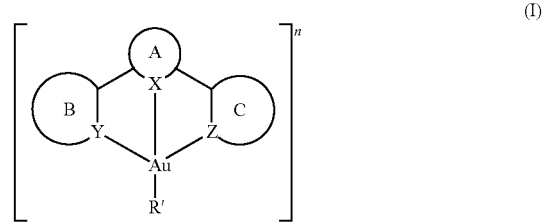

(I)

wherein:
R', X, Y, Z, ring A, ring B and ring C are as defined in claim 1.

10. The light-emitting device of claim 9 wherein the light-emitting layer is prepared using vacuum deposition or solution processing technique.

11. The light-emitting device of claim 9, wherein the gold(III) compound has photoluminescence properties within a range of 380 to 1050 nm.

12. The gold(III) compound according to claim of claim 1, wherein the X and the Y are carbon, and the Z is nitrogen; wherein the ring A and the ring B are the cyclic structures of the phenyl groups; and wherein the ring C is the cyclic structure of pyridine, quinoline, or isoquinoline.

13. The gold(III) compound according to claim of claim 1, wherein R' is the thiolate or the carbazole.

* * * * *